United States Patent
Wang

(10) Patent No.: US 7,129,572 B2
(45) Date of Patent: Oct. 31, 2006

(54) SUBMEMBER MOUNTED ON A CHIP OF ELECTRICAL DEVICE FOR ELECTRICAL CONNECTION

(76) Inventor: Chung-Cheng Wang, No. 16, Alley 10, Lane 125, Daxing 11th St., Taiping City, Taichung County (TW)

( * ) Notice: Subject to any disclaimer, the term of this patent is extended or adjusted under 35 U.S.C. 154(b) by 0 days.

(21) Appl. No.: 11/199,273

(22) Filed: Aug. 9, 2005

(65) Prior Publication Data

US 2006/0038278 A1 Feb. 23, 2006

(30) Foreign Application Priority Data

Aug. 18, 2004 (TW) .............................. 93124883 A
Nov. 17, 2004 (TW) .............................. 93135164 A

(51) Int. Cl.
*H01L 23/02* (2006.01)
(52) U.S. Cl. ...................... 257/686; 257/688; 438/109; 438/117
(58) Field of Classification Search ................ 257/666, 257/688, 686
See application file for complete search history.

(56) References Cited

U.S. PATENT DOCUMENTS 6,765,299 B1 * 7/2004 Takahashi et al. .......... 257/777

* cited by examiner

*Primary Examiner*—Leonardo Andjuar
*Assistant Examiner*—Krista Soderholm
(74) *Attorney, Agent, or Firm*—Bacon & Thomas, PLLC

(57) ABSTRACT

A submember for electrical device is disclosed. Said submember is mounted on a chip of electrical device. An embodiment for the submember comprised of an insulator and a plurality of conductive elements, wherein the conductive elements embedded in the insulator and a portion of conductive element exposed to the insulator for electrical connection, then (i). the reliability of submember is enhanced; (ii). the material of insulator enables to be saved; and (iii). the thickness of submember is thinner and the heat dissipation of chip enhanced; moreover, a portion of the conductive element may be protruding the insulator for avoiding a short-circuited problem of conductive wire, moreover, the conductive element may be staircase-shaped, then, not only the reliability of submember is enhanced, but the short circuit problem of conductive wire is also avoided; the conductive element may further include an extending portion, furthermore, the conductive element may be placed in a cavity as required.

13 Claims, 19 Drawing Sheets

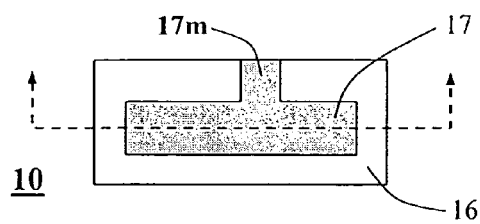
Fig. 1 A a
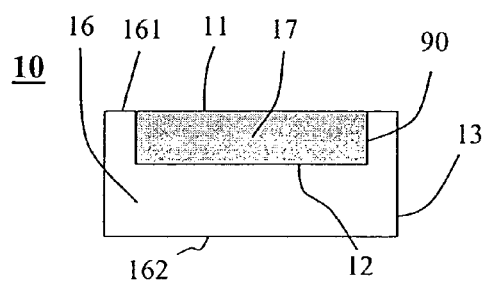
Fig. 1 A b
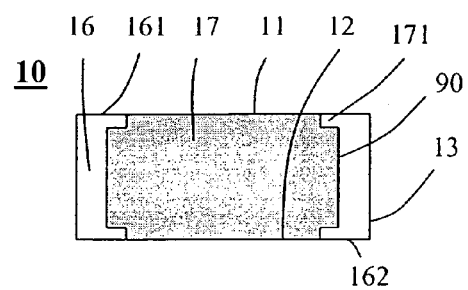
Fig. 1 B
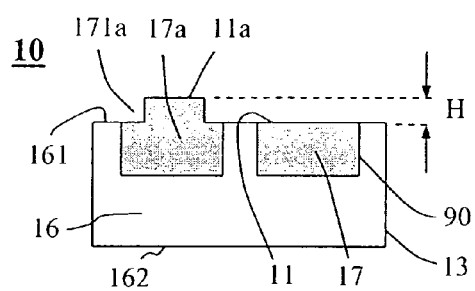
Fig. 1 C
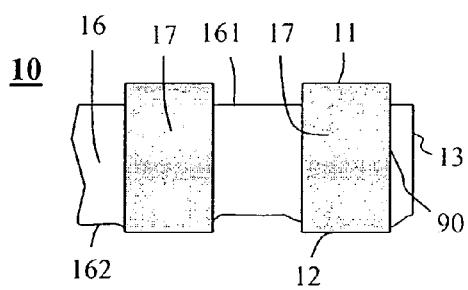
Fig. 1 D
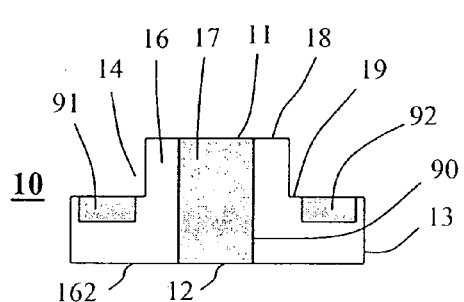
Fig. 1 E
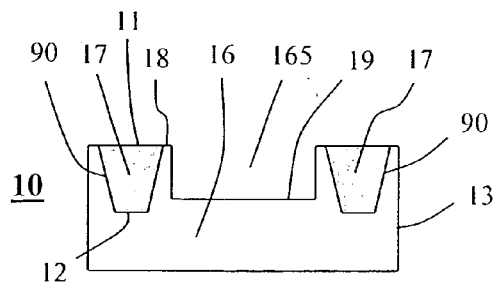
Fig. 1 F

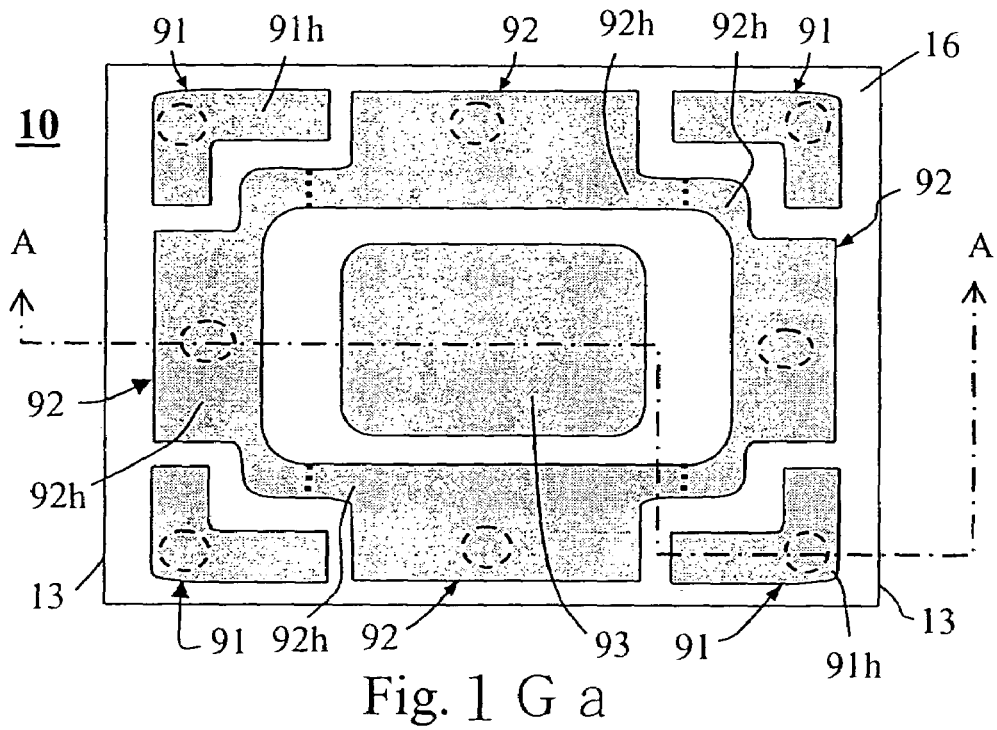
Fig. 1 G a
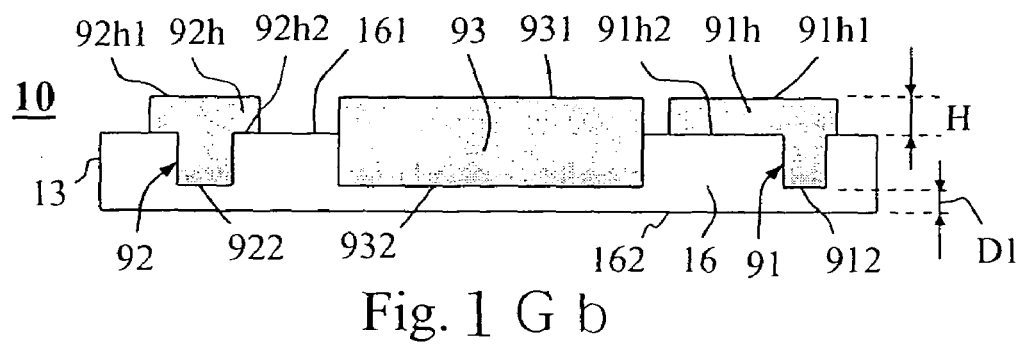
Fig. 1 G b
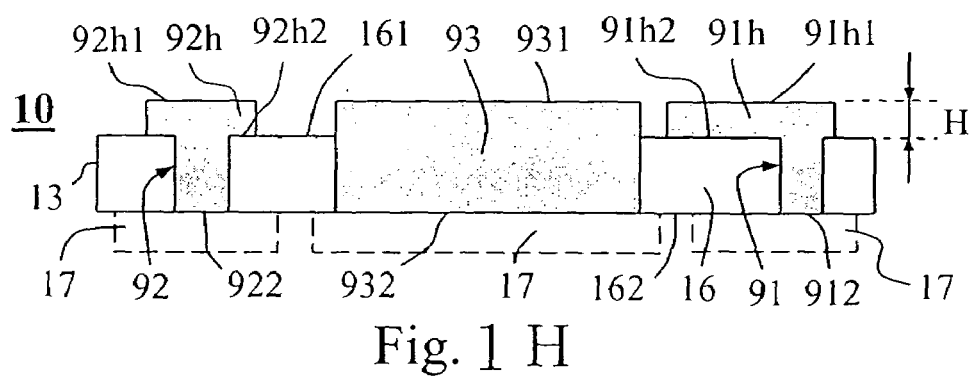
Fig. 1 H

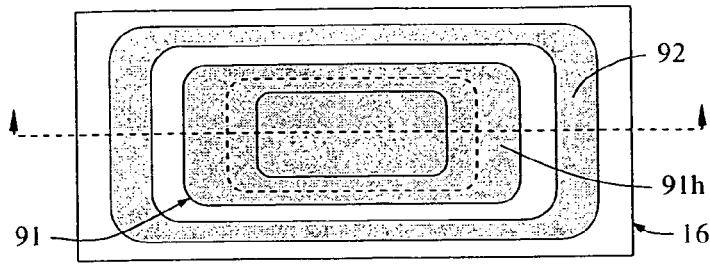
Fig. 1 I a
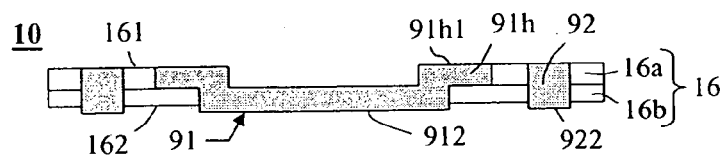
Fig. 1 I b
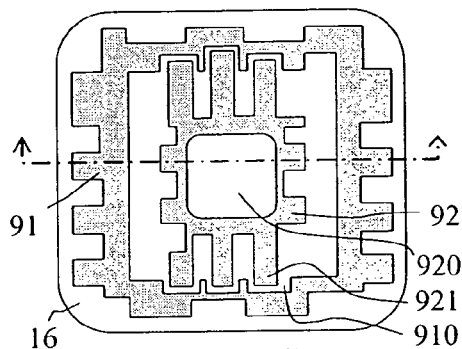
Fig. 1 J a
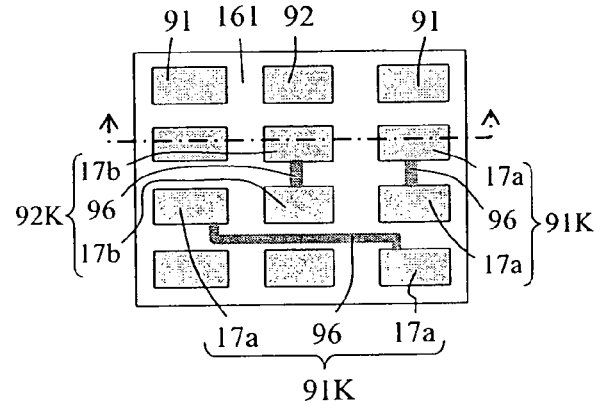
Fig. 1 K a
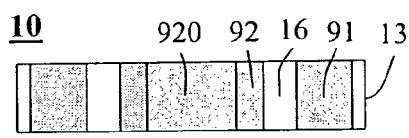
Fig. 1 J b
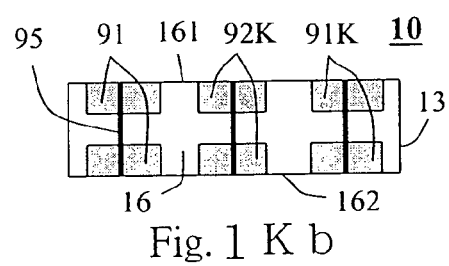
Fig. 1 K b

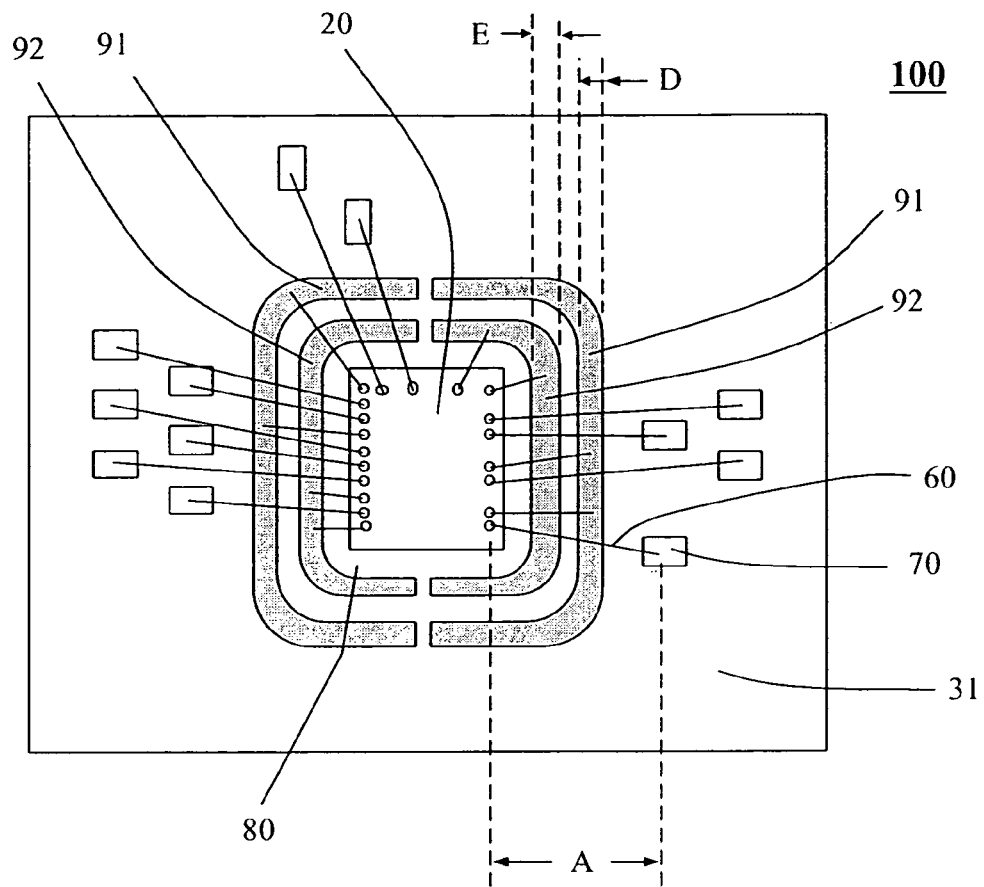
Fig. 2 2 A
( Prior Art )
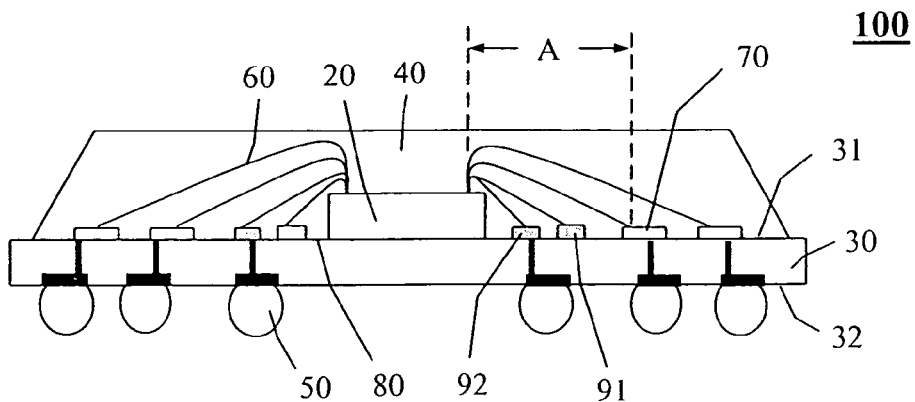
Fig. 2 2 B
( Prior Art )

SUBMEMBER MOUNTED ON A CHIP OF ELECTRICAL DEVICE FOR ELECTRICAL CONNECTION

BACKGROUND OF THE INVENTION

1. Field of the Invention

The present invention relates to a submember which is involved in an electrical device, more particularly, it relates to an submember mounted on a chip is for enhancing the reliability of electrical device, downsizing the electrical device and saving materials of electrical device.

2. Description of the Related Art

Nowadays, electrical devices are becoming more powerful than before, and users of electrical device are continually demanding better reliability of electrical devices, thinner electrical devices and inexpensive electrical devices, In this manner, manufacturers of electrical device research and develop the improved electrical devices for achieving the demands mentioned-above.

At first, referring to FIG. 22A, 22B (FIG. 22B is a cross-sectional view of FIG. 22A) show a conventional 100 comprising: a base 30 serving as a substrate includes a first surface 31, an opposing second surface 32, a receiving area 80 is for accommodating a chip, a plurality of conductive fingers 70, two power supply rings 91 for supplying different voltages such as 1.33V or 3.3V etc. to the chip 20, two power supply rings 92 for grounding, and a plurality of solder balls 50, wherein, the conductive fingers 70 surrounding the power supply rings 91 and the solder balls 50 attached on the second surface 32 of base 30, said solder balls 50 electrically connected the base 30 to the outside (such as a mother board etc.); a chip 20 mounted on the receiving area 80 of base 30; a plurality of conductive wires 60 electrically connected the chip 20 to the conductive fingers 70, the power supply rings 91,92 respectively; and an encapsulant encapsulates the chip 20, base 30 and the conductive wires 60; According to said conventional electrical device 100, due to the conductive fingers 70 surrounding the power supply rings 91, In this manner, the distance "A" between the chip 20 and the conductive finger 70 becomes the longest, then the conductive wires 60 which are electrically connected the chip 20 to the conductive fingers 70 also become the longest (because it is necessary for said conductive wires 60 to pass through the width "D", "E" of power supply ring 91, 92.), As this result, more materials of conductive wire 60 are needed, wherein, the conductive wires 60 are made of gold usually; since more conductive wires 60 are used, then the cost will be higher, In addition, due to the power supply rings 91, 92 are all situated on the first surface 31 of base 30, wherein if the amount of said power supply rings 91, 92 are increased, then the amount of conductive finger 70 will be reduced, as it has been mentioned that "Electrical devices are becoming more powerful nowadays." If the amount of conductive fingers 70 on the first surface 31 of base 30 is not enough sufficiently, then the function of electrical device 100 will be limited (due to the more powerful the electrical device 100 is, the more conductive fingers are needed.), Nevertheless, it is difficult to setup both of the increased-gradually conductive fingers and the power supply rings on the same surface of base 30 without changing the size of said base 30. Therefore, in order to solve the problems mentioned-above, an interconnecting mean such as a circuit board-an interconnecting apparatus or an interconnecting substrate etc. is used in an electrical device, as shown in FIGS. 23A, 23B and FIG. 24, (FIG. 23B is a cross-sectional view taken along the "A—A" line in FIG. 23A ); FIGS. 23A, 23B and FIG. 24 show the last two steps of manufacturing a conventional circuit board 4, Firstly, refer to FIG. 23A, 23B showing a conductive layer 9 consists of a plurality of circuits 9$k$, 9$m$, wherein the circuits 9$k$, 9$m$ connect to each other by means of the traces 2 respectively, said conductive layer 9 formed on said insulating layer 5, wherein a conductive material(s) (not shown) such as nickel, gold, palladium, silver or the like is(are) coated on the conductive layer 9 by means of a plating process for enhancing the quality of electrical connection (i.e. the reliability that the conductive layer 9 electrically connect to the conductive wires enables to be enhanced.) In addition, the conductive layer 9 is a predetermined shape (i.e. strip or the like) for easier operating the plating process and the mass production; Secondly, FIG. 24 shows After plating process, providing a blade "B" for sawing both the conductive layer 9 and the insulating layer 5, and then a circuit board 4 is accomplished, Nevertheless, due to the conductive layer 9 (i.e. the circuits 9$k$, 9$m$) is formed on the insulating layer 5, It is easy for the portion 9$a$ of conductive layer 9 which is immediately adjacent to the blade "B" to be peeling off the insulating layer 5 while operating the sawing process. Should such a peeling-off problem occur, the reliability of said circuit board 4 will become poor. wherein although an insulating film such as a solder mask (not shown) can be provided upon the insulating layer 4 and a portion of the conductive layer 9 for protecting the circuit board 4, However the cost is increased, moreover, the risk of said peeling-off problem is still there, because the sawing process is needed to be operating; As shown in FIG. 25, wherein the conventional circuit board 4 manufactured by the method mentioned in FIGS. 23A, 23B and FIG. 24 is mounted on the chip 20, said circuit board 4 includes an insulating layer 5 which is selectively made by a fiber glass, epoxy, ceramics, silicon etc. and a conductive layer 9 which consists a plurality of circuits 9$k$, 9$m$ and is served as power/ground ring; a plurality of conductive wires 60 electrically connected the chip 20 among the circuit board 4 and the base 30; due to the power rings have already been moved onto the circuit board 4, then there is not any power ring on the base 30, and then the conductive wires 60 which are electrically connected the chip 20 to the base 30 enable to be shortened (due to the conductive wires 60 electrically connected the chip 20 to the conductive fingers 70 are not needed to pass over the width "D", "E" of power rings 9$k$, 9$m$, then the distance "A" between said chip 20 and said conductive finger 70 becomes shortened), and then the material of said conductive wires 60 enable to be saved; Nevertheless due to the conductive layer 9 is formed on the insulating layer 5 of circuit board 4, and the more serious problems caused by the peeling-off problem described in FIG. 24 will be happened by means of thermal effects (stress), Detailed descriptions as follows.

Due to the chip 20 generates heat while operating, then the thermal stress starts to affect the chip 20, the insulating layer 5, the conductive layer 9, the conductive wires 60, the base 30, the solder balls 50 and the encapsulant 40 respectively, during the period of thermal effects; wherein because the coefficient of thermal expansion of each part (i.e. the chip 20, the insulating layer 5, the conductive layer 9, the conductive wire 60, the base 30, the solder ball 50 and the encapsulant 40) is different from each other, then the thermal effects will be more serious to each part. In this manner, If the portion (see "9$a$" in FIG. 24) of the conductive layer 9 is separated from the insulating layer 5 at first, then said portion (9$a$) will be moving, and then the other portion of conductive layer 9 which is connected to the portion (9$a$)

will be separated from the insulating layer 5 gradually (i.e. the more the portion (9*a*) is moving, the more the portion of conductive layer 9 will be separated from the insulating layer 5), eventually, once the portion of conductive layer 9 which is electrically connected to the end of conductive wire 60 is also separated from the insulating layer 5 and starts moving, then said end of conductive wire 60 which is electrically connected to the conductive layer 9 will be separated from the conductive layer 9 and/or the conductive wire 60 which is electrically connected the chip 20 to the conductive layer 9 will be broken by means of the thermal stress, in this manner, the electrical device 100 will be damaged or not functional well, then the reliability of said electrical device 100 becomes poor; Furthermore, due to the conductive layer 9 is formed on the insulating layer 5, then (i). the thickness of said circuit board 4 is thicker; and (ii). the material of insulating layer 5 needs to be used more.

SUMMARY OF THE INVENTION

It is therefore an object of the invention to solve the mentioned-above problems, according to the present invention, the submember includes an insulator and a plurality of conductive elements, wherein the conductive element is embedded in the insulator, and a portion of conductive element exposed to the surface of insulator for external connection, meanwhile the conductive element may be selectively serving as a positive supply terminal, a negative supply terminal etc.; the submember of present invention is coupled with a chip, (i.e. the submember is mounted on a chip,) wherein due to the conductive element embedded in the insulator, then (i). the surface of conductive element contacted with the insulator is increased, then the conductive element can be rigidly held by the insulator more securely, in this manner, the reliability of submember is enhanced; (ii). the material of insulator enables to be saved; and (iii). the thickness of submember enables to be thinner; moreover, a portion of the conductive element enables to be protruding the insulator for avoiding a short-circuited problem of conductive wire and improving the quality of electrical device, moreover, the conductive element may further include an extending portion, furthermore, the conductive element may be placed in a cavity of submember.

The mentioned-above and further objects of the present invention will be more adequately appeared from the detailed description, accompanying drawings and appended claims as follow.

BRIEF DESCRIPTION OF THE DRAWINGS

FIG. 1Aa shows a top view of the first embodiment of submember in accordance with the present invention.

FIG. 1Ab shows a cross-sectional view of FIG. 1Aa.

FIGS. 1B–1F show cross-sectioned views of the first embodiment of submember in accordance with the present invention.

FIG. 1Ga shows a top view of the first embodiment of submember in accordance with the present invention.

FIG. 1Gb shows a cross-sectional view taken along an A—A line in FIG. 1Ga.

FIG. 1H shows a cross-sectional view of the first embodiment of submember in accordance with the present invention.

FIG. 1Ia shows a top view of the first embodiment of submember in accordance with the present invention.

FIG. 1Ib shows a cross-sectional view of FIG. 1Ia.

FIG. 1Ja shows a top view of the first embodiment of submember in accordance with the present invention.

FIG. 1Jb shows a cross-sectional view of FIG. 1Ja.

FIG. 1Ka shows a top view of the first embodiment of submember in accordance with the present invention.

FIG. 1Kb shows a cross-sectional view of FIG. 1Ka.

FIG. 1L show a cross-sectional view of first embodiment of submember in accordance with the present invention.

FIG. 1Ma shows a top view of the second embodiment of submember in accordance with the present invention.

FIG. 1Mb shows a cross-sectional view of FIG. 1Ma.

FIG. 1N shows a cross-sectional view of the second embodiment of submember in accordance with the present invention.

FIG. 1P–1T show cross-sectional views of second embodiment of submember in accordance with the present invention.

FIG. 1U shows a cross-sectional view of the third embodiment of submember in accordance with the present invention.

FIG. 1U-1~1U-7 show cross-sectional views of alternatives of the third embodiment of submember shown in FIG. 1U in accordance with the present invention.

FIG. 1U-8*a* shows a top view of alternative of the third embodiment of submember shown in FIG. 1U in accordance with the present invention.

FIG. 1U-8*b* shows a cross-sectional view of FIG. 1U-8*a*.

FIG. 2A is a top view showing a preferred embodiment of electrical device, in accordance with the invention, the submember is used by the first embodiment of submember of the present invention.

FIG. 2B shows a cross-sectional view of FIG. 2A.

FIG. 3 is a cross-sectional view showing another preferred embodiment of electrical device, n accordance with the invention, the submember is used by the first embodiment of submember of the present invention.

FIG. 4 is a cross-sectional view showing further another preferred embodiment of electrical device, in accordance with the invention, the submember is used by the first embodiment of submember of the present invention.

FIG. 5 is a cross-sectional view showing further another preferred embodiment of electrical device, in accordance with the invention, the submember is used by the first embodiment of submember of the present invention.

FIG. 6 is a cross-sectional view showing further another preferred embodiment of electrical device, in accordance with the first embodiment of submember of the present invention.

FIG. 7 is a cross-sectional view showing further another preferred embodiment of electrical device, in accordance with the invention, the submember is used by the first embodiment of submember of the present invention.

FIG. 8 is a cross-sectional view showing further another preferred embodiment of electrical device, in accordance with the invention, the submember is used by the first embodiment of submember of the present invention.

FIG. 22A shows a top view of electrical device according to a prior art.

FIG. 22B shows a cross-sectional view of FIG. 22A.

FIG. 25 shows a cross-sectional view of electrical device according to a prior art, the conventional circuit board mounted on the chip is manufactured by the method mentioned in FIGS. 23A, 23B and FIG. 24.

DETAILED DESCRIPTION OF PREFERRED EMBODIMENTS

A first embodiment of submember of the present invention will be explained with reference to FIGS. 1Aa–1L, which comprised of an insulator and a plurality of conductive elements.

Figure 1:
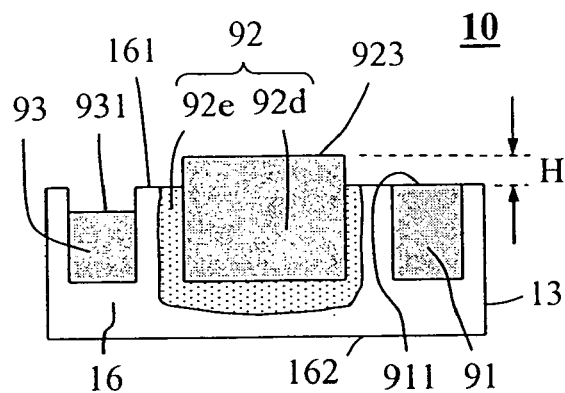
Figure 1:
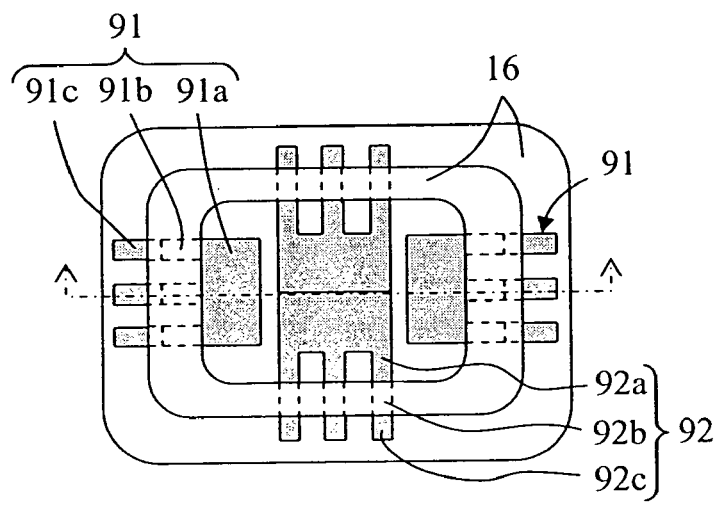
Figure 1:
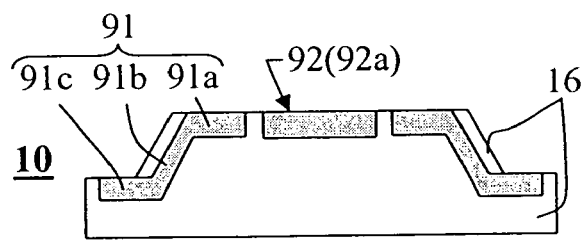
Figure 1:
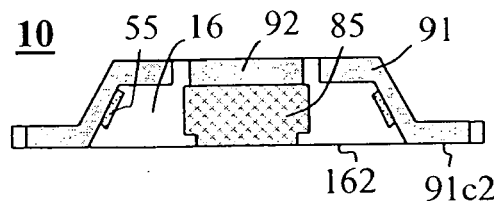
Figure 1:
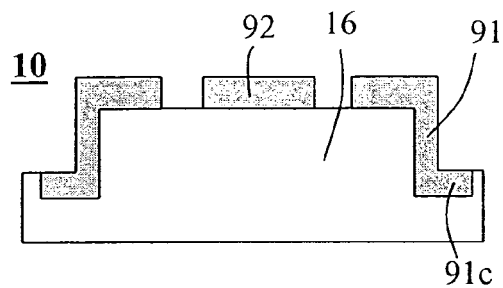
Figure 1:
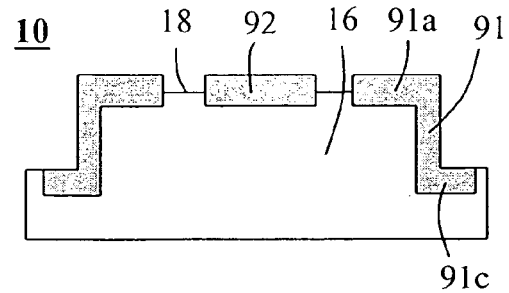
Figure 1:
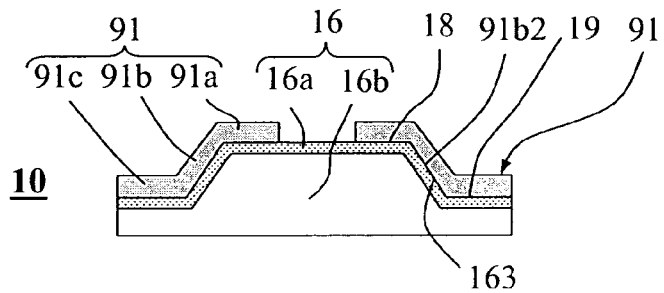
Figure 1:
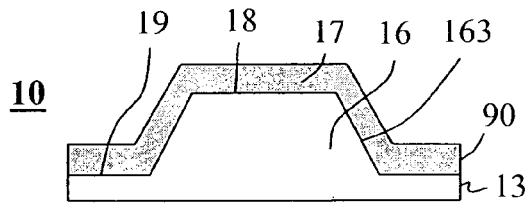
Figure 1:
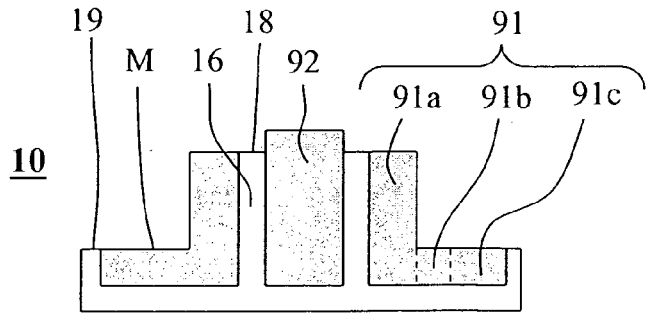
Figure 1:
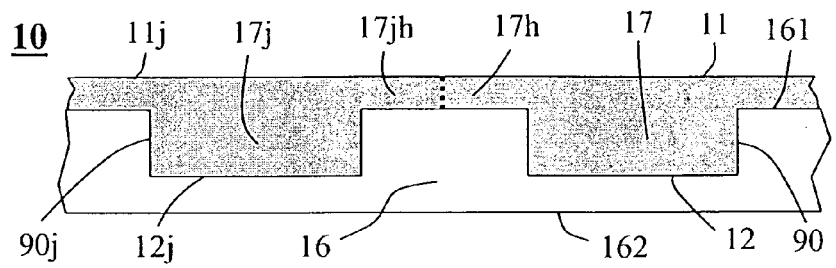
Figure 1:
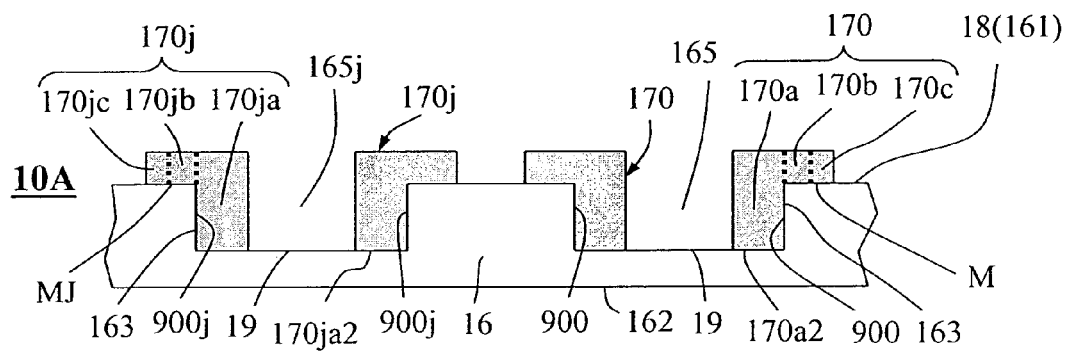
Figure 1:
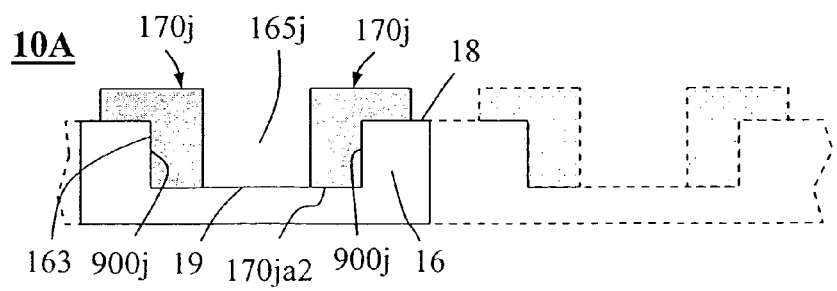
Figure 1:
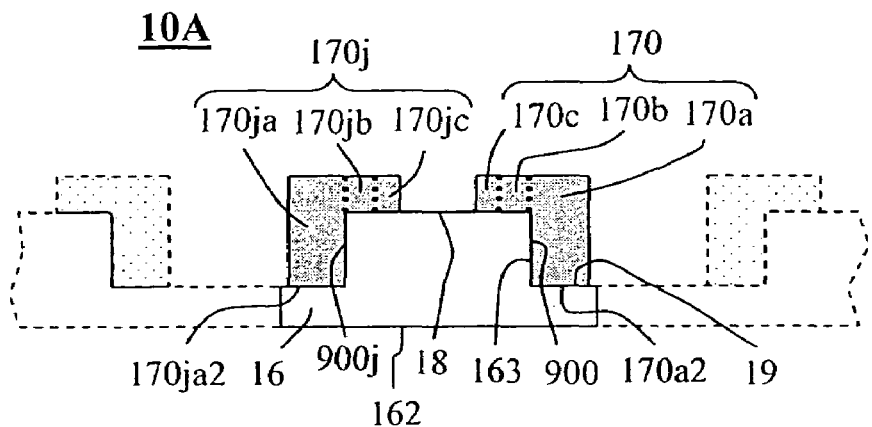
Figure 1:
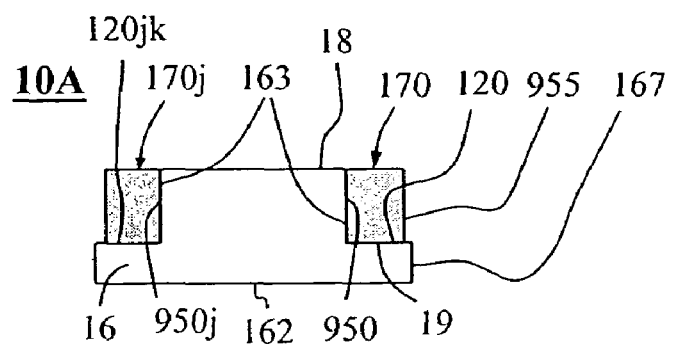
Figure 1:
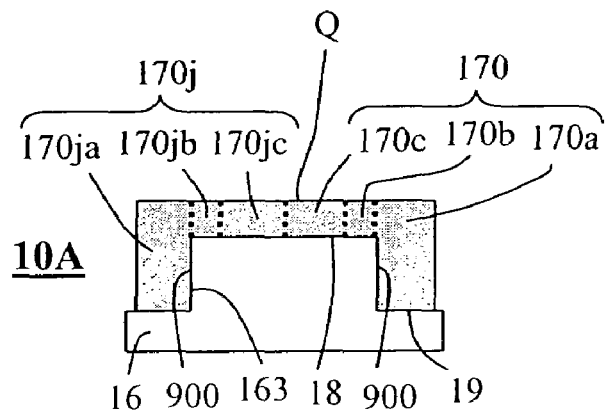
Figures 1, 1U, 2, 3, 4, 5, 6, 7:
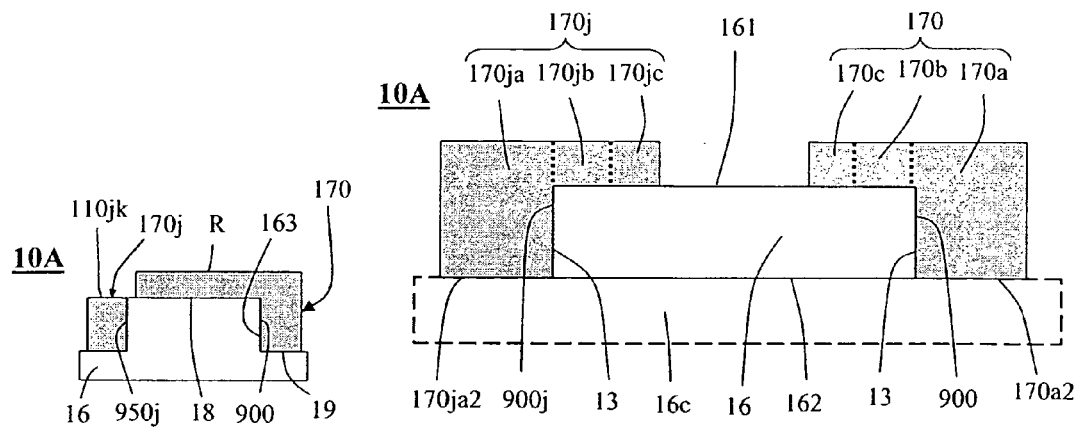

FIGS. 1Aa, 1Ab (FIG. 1Ab is a cross-sectional view of FIG. 1Aa) show a submember 10 comprising: an insulator 16 and a conductive element 17; the insulator 16 having an upper surface 161, a lower surface 162 and a side wall 13; the conductive element 17 having an upper surface 11, a lower surface 12, a side edge (or wall) 90 and a portion 17m; wherein the conductive element 17 is encapsulated by the insulator 16, in this manner, the conductive element 17 (including the side edge 90 and the lower surface 12) is embedded into the insulator 16, wherein, the upper surface 11 of conductive element 17 is exposed to the upper surface 161 of insulator 16 for electrical connection, said conductive element 17 may be selectively serving as a power (positive) supply terminal (refer to numeral "91" in FIG. 1E), a ground (negative) supply terminal (refer to numeral "92" in FIG. 1E), a heat path for heat dissipation (refer to the description of FIG. 14) or a conductive terminal for transferring signal such as a input/output; the submember 10 will be mounted on a chip (see FIG. 2A, 2B); Wherein due to the conductive element 17 is embedded in the insulator 16 (i.e. the conductive element 17 is not formed on the insulator 16 but both the lower surface 12 of conductive element 17 and the side edge 90 of conductive element 17 are embedded in the insulator 16), in this manner, the submember 10 surface contacted with the insulator 16 is increased, then the submember 10 encapsulated by the insulator 16 more securely, and then the peeling-off problems enables to be avoided while operating the sawing process (mentioned-above), as this result, the reliability of submember 10 enables to be enhanced, (i.e. due to the portion 17m of conductive element 17 is also embedded in the insulator 16, then said portion 17m of conductive element 17 will be rigidly held by the insulator 16 more securely while a blade is sawing the insulator 16 and the portion 17m of conductive element 17, and then the peeling-off problem will be avoided), furthermore, the mentioned-above problems (i.e. the end of conductive wire electrically connected to the conductive layer separated from each other and/or the conductive wire which is electrically connected the chip to the conductive layer is broken by means of the thermal stress.) will be avoided too, in this manner, the reliability of submember 10 is also enhanced; moreover, due to the conductive element 17 embedded in the insulator 16, then the thickness of submember 10 becomes thinner; furthermore, due to the conductive element 17 embedded in the insulator 16, then the material of insulator 16 enables to be saved, and due to the submember 10, the conductive wires (see FIG. 2A, 2B) also enable to be shortened and the materials of conductive wire enable to be saved; the other more advantages of the submember 10 will be explained in FIGS. 2–21.

FIG. 1B shows a submember 10 comprising an insulator 16 and a conductive element 17 which is embedded therein, wherein the conduction element 17 having a recessed portion 171, due to the recessed portion 171, the conductive element 17 enables to be encapsulated by the insulator 16 more securely (i.e. the conductive element 17 enables to be rigidly held by the insulator 16 more securely), then the reliability of submember 10 enhanced, meanwhile, the lower surface 12 of conductive element 17 also exposed to the lower surface 162 of insulator 16. In this manner, the submember 10 may be electrically connected to outside by both of the upper surface 11 and the lower surface 12 of conductive element 17; furthermore, due to the lower surface 12 of conductive element 17 exposed to the lower surface 162 of insulator 16, then the heat dissipation of chip also enables to be enhanced (refer to the detailed description of FIG. 14).

FIG. 1C shows a submember 10 comprising an insulator 16 and a plurality of conductive elements 17, 17a, wherein the conductive element 17a having a receded portion 171a, these conductive element 17, 17a are all embedded in the insulator 16, wherein the upper surface 11a of conductive element 17a is protruded and exposed to the upper surface 161 of insulator 16 for electrical connection, and there is a height "H" between the upper surface 11a of conductive element 17a and the upper surface 11 of conductive element 17, in this manner, both the upper surface 11a of conductive element 17a and the upper surface 11 of conductive element 17 are not in the same horizontal level, and then it can prevent the conductive wires (see the "60k", "60m" in FIG. 8) from touching each other. So that the short circuit problem of electrical device (see the FIG. 8) enables to be avoided, furthermore, due to the upper surface 11a of conductive element 17a is protruding the upper surface 161 of insulator 16, then the surface of submember 10 contacted with the encapsulant (see the "40" in FIG. 8) is increased, and then the submember 10 enables to be encapsulated by the encapsulant (40) more securely, as this result, the submember 10 will not be separated (peeled-off) from the encapsulant (40) easily, and then the reliability of electrical device enhanced; Moreover, the conductive element 17, 17a may also have an extending portion (refer to FIG. 1Ga, 1Gb).

FIG. 1D shows a submember 10 comprising: an insulator 16 and a plurality of conductive elements 17 which are embedded therein, wherein each lower surface 12 of conductive element 17 is also protruded and exposed to the lower surface 162 of insulator 16 for electrical connection and enhancing the heat dissipation of the submember 10.

FIG. 1E shows a submember 10 comprising an insulator 16 and a plurality of conductive elements 17, 91, 92; the insulator 16 having a recessed portion 14, in this manner, the submember 10 having a first upper surface 18 and a second upper surface 19, said conductive elements 17, 91, 92 are all embedded in the insulator 16, wherein the conductive element 91 serving as a positive supply terminal, the conductive element 92 serving as a negative supply terminal, both of the upper surfaces of conductive element 91, 92 are exposed to the second upper surface 19 of submember 10 for external connection; said conductive element 17 serving as a heat path, wherein the upper, lower surfaces 11, 12 of conductive element 17 are exposed to the first upper, lower surfaces 18, 162 of submember 10 respectively for enhancing the heat dissipation of submember 10.

FIG. 1F shows a submember 10 comprising an insulator 16 and a plurality of conductive elements 17; the insulator 16 having a cavity 165, in this manner, a chip (not show), an encapsulant (not show) etc. can be placed in said cavity 165, moreover, the submember 10 surface contacted with an encapsulant (not show) increased, then the submember 10 encapsulated by the encapsulant (not show) more securely, and the reliability of submember 10 enhanced; the conductive elements 17 embedded in the insulator 16, wherein each conductive element 17 is formed by a pre-determined shape and each side edge 90 of conductive element 17 is embedded in the insulator 16.

FIGS. 1Ga, 1Gb (FIG. 1Gb is a cross-sectional view taken along an "A—A" line in FIG. 1Ga) show a submember 10 comprising: an insulator 16; a plurality of conductive elements (17) serving as positive supply terminals 91, 93 and negative supply terminals 92 are embedded in the insulator 16, wherein each negative supply terminal 92 having an extending portion 92h which is coupled with each other, in this manner, each negative supply terminal 92 enables to be electrically connected to each other and each negative supply terminal 92 also enables to be adjacent to each other, and each lower surface 92h2 of extending portion 92h is situated upon the upper surface 161 of insulator 16; meanwhile, each positive supply terminal 91 also having an extending portion 91h which is surrounding the negative supply terminals 92 which are coupled with each other, and each lower surface 91h2 of extending portion 91h is also situated on the upper surface 161 of insulator 16, said upper surface 91h1 of positive supply terminal 91, said upper surface 92h1 of negative supply terminal 92 and said upper surface 931 of the positive supply terminal 93 are all protruded and exposed to the upper surface 161 of insulator 16 for external connection, wherein there is a height "H" between the upper surface (91h, 92h, 931) and the upper surface 161 of insulator 16; meanwhile, the extending portions 91h, 92h are as close to the periphery (i.e. side walls 13) of insulator 16 as possible for shortening both the length of conductive wires (see "60" in FIG. 14) which are electrically connected the submember (see "10" in FIG. 14) to the conductive fingers (see "70" in FIG. 14) and the length of conductive wires (see FIG. 14) which are electrically connected the chip (see "20" in FIG. 14) to the submember (see "10" in FIG. 14), in this manner, the conductive wires mentioned-above enable to be shortened, then the materials of conductive wire enable to be saved; furthermore due to the extending portion 91h, 92h situated on the upper surface 161 of insulator 16, it allows the extending portions 91h, 92h to extend upon the upper surface 161 of insulator 16 freely, the extending portion 91h, 92h may be formed by predetermined shapes (i.e. patterns). In this manner, the restriction of designation of submember 10 will be reduced; in addition, due to a portion of positive supply terminal 91, a portion of negative supply terminal 92 and a portion of (the other) positive supply terminal 93 are embedded in the insulator 16, and the lower surface 912 of positive supply terminal 91, the lower surface 922 of negative supply terminal 92 and the lower surface 932 of (the other) positive supply terminal 93 are all encapsulated by the insulator 16, wherein the lower surfaces 912, 922, 932 are as close to the lower surface 162 of insulator as possible, in this manner, the distance "D1" between the lower surface (912, 922, 923) and the lower surface 162 of insulator will be shortened, then the heat dissipation of chip (refer to FIG. 14) will be enhanced; meanwhile, due to a portion of each conductive element (91, 93, 92) protruding the upper surface 161 of insulator, then each surface of conductive element (91, 93, 92) contacted with an encapsulant (see "40" in FIG. 14) is increased, then the submember 10 encapsulated by the encapsulat (40) more securely, and the reliability of submember 10 enhanced (see FIG. 14).

FIG. 1H shows (basically, the structure of submember 10 shown in FIG. 1H is similar to the structure of submember 10 shown in FIGS. 1Ga, 1Gb), the difference is that said FIG. 1H shows the lower surface 912 of positive supply terminal 91, the lower surface 922 of negative supply terminal 92 and the lower surface 932 of (the other) positive supply terminal 93 are all exposed to the lower surface 162 of insulator 16, then the heat dissipation of chip (refer to FIG. 14) will be enhanced; wherein the lower surfaces 912, 922, 932 may also be protruding the lower surface 162 of insulator 16 as required; moreover, a plurality of added conductive elements (dotted ones) 17 may be coupled with the lower surface of said submember 10 (i.e. the lower surface 162 of insulator 16 associated with the lower surfaces 912/932, 922 of the positive, negative supply terminals 91/93, 92), and each conductive element 17 connected to each corresponding positive, negative supply terminal 91/93, 92 for electrical connection, wherein a solder mask (not shown) may also be provided upon the lower surface 162 of insulator 16 and a portion of each conductive element 17 for protecting said submember 10 as required.

FIGS. 1Ia, 1Ib (FIG. 1Ib is a cross-sectional view of FIG. 1Ia) show a submember 10 comprising an insulator 16 which consists of a first portion 16a and a second portion 16b; a positive supply terminal 91 and a negative supply terminal 92 are encapsulated by the insulator 16, wherein the extending portion 91h of positive supply terminal 91 is encapsulated by the first portion 16a of insulator 16, and the upper surface 91h1 of extending portion 91h exposed to the upper surface 161 of insulator 16 for external connection, the lower surface 912 of positive supply terminal 91 and the lower surface 922 of negative supply terminal 92 are all protruding the lower surface 162 of insulator for electrical connection; wherein both the positive supply terminal 91 and the negative supply terminal 92 may be encapsulated by a single insulator 16 (i.e. it is not necessary for the insulator 16 to be consisted of a first portion 16a and a second portion 16b; refer to FIG. 1H) as required, meanwhile the positive supply terminal 91 may further comprise a through hole as required.

FIGS. 1Ja, 1Jb (FIG. 1Jb is a cross-sectional view of FIG. 1Ja) show a submember 10 comprising: an insulator 16, a positive supply terminal 91 and a negative supply terminal 92 are all embedded in said insulator 16, wherein the positive supply terminal 91 having a plurality of recessed portions 910, in this manner, each protruding portion 921 of negative supply terminal 92 enables to be situated in each corresponding recessed portion 910, then the conductive wire (not shown) electrically connected a chip (not shown) to the protruding portion 921 of negative supply terminal 92 will be able to be shortened, and the material of conductive wire will be able to be saved; moreover, the negative supply terminal 92 still having a through hole 920, said through hole 920 is used for placing chip, encapsulant, component or conductive wire, etc.

FIGS. 1Ka, 1Kb (FIG. 1Kb is a cross-sectional view of FIG. 1Ka) show a submember 10 comprising an insulator 16, a plurality of positive supply terminals 91, 91k and a plurality of negative supply terminals 92, 92k; wherein said positive supply terminal 91k consists of a plurality of conductive elements 17a and a conductive path 96 which is connected the conductive element 17a to another conductive element 17a; said negative supply terminal 92k consists of a plurality of conductive elements 17b and a conductive path 96 which is connected the conductive element 17b to another conductive element 17b; said positive supply terminal 91, 91k and said negative supply terminal 92, 92k are embedded in the insulator 16 and situated in its upper, lower surfaces 161, 162 respectively, wherein the positive, negative supply terminal 91/91k, 92/92k may be employed as conductive terminals for transferring input/output signals (refer to FIG. 21); in addition, a plurality of via 95 electrically connected the supply terminals 91, 92k, 91k which are situated in the upper surface 161 of insulator to each corresponding supply terminal 91, 92k, 91k which are situated in the lower surface 162 of insulator respectively. In this manner, the submember 10 enables to electrically connect to outside by means of the supply terminals 91, 91k, 92, 92k which situated in both surfaces (upper, lower surfaces 161, 162) of insulator 16 respectively.

FIG. 1L shows a submember 10 comprising an insulator 16, a plurality of positive supply terminals 91, 93 and negative supply terminal 92 embedded therein and each upper surface (911, 923, 931) is exposed to the upper surface 161 of insulator 16 for external connection, wherein said negative supply terminal 92 consists of a first portion 92d and a second portion 92e, said upper surface 931 of positive supply terminal 93 and said upper surface 161 of insulator 16 are not in the same horizontal level (i.e. the upper surface 931 is below the upper surface 161), meanwhile the upper surface 923 of negative supply terminal 92 is protruding the upper surface 161 of insulator 16 (i.e. there is a height "H" between the upper surface 923 and the upper surface 161). Moreover an insulator layer (not shown) may be attached to the upper surface 161 of insulator 16 for preventing moisture from getting into the insulator 16 as required. Furthermore the first portion 92d of negative supply terminal 92 is encapsulated by the second portion 92e. wherein the second portion 92e may be made of conductive epoxy, tin or the like.

A second embodiment of submember of the present invention will be explained with reference to FIG1. 1M-1N and 1P-1T which comprised of an insulator and conductive element, wherein the conductive element consists a first portion, a second portion and a third portion, moreover, the submember of present invention may further comprise a heat spreader, an adhesive means etc. Detailed description as follow: FIGS. 1Ma, 1Mb (FIG. 1Mb is a cross-sectional view of FIG. 1Ma) show a submember 10 comprising: an insulator 16 and a plurality of positive, negative supply terminals 91, 92; said positive, negative supply terminals 91, 92 are encapsulated by the insulator 16 and embedded therein, said positive, negative supply terminals 91, 92 are all staircase-shaped and having a first portion 91a/92a, a second potion 91b/92b and a third potion 91c/92c respectively, said second portion 91b is between the first portion 91a and the third portion 91c, said second portion 92b is between the first portion 92a and the third portion 92c, wherein each second portion 91b/92b encapsulated by the insulator 16 and not exposed to the surface of insulator 16, but each upper surface of first portion 91a/92a and each upper surface of third portion 91c/92c are exposed to the surface of insulator 16 for electrical connection respectively; due to the first portion 91a/92a and the third potion 91c/92c are not in the same horizontal level. Then it prevents conductive wires from short-circuit problem (refer to the descriptions for preventing from the short circuit problem in FIG. 15), in this manner, the reliability of electrical device enables to be enhanced, moreover, due to each upper surface of second portion 91b/92b encapsulated by the insulator 16 and not exposed to the surface of insulator 16, then the surfaces of positive, negative supply terminals 91, 92 contacted with the insulator 16 are increased, and then the positive, negative supply terminals 91, 92 are rigidly held by the insulator 16 more securely, in this manner, the reliability of submember 10 enhanced. Furthermore, due to each upper surface of second portion 91b/92b is not exposed to the surface of insulator 16, then the shapes of supply terminal (91, 92) become discontinuous according to the surface of insulator 16 (i.e. each upper surface of second portion 91b/92b is not exposed to the surface of insulator, but each upper surface of first portion 91a/92a and each upper surface of third portion 91c/92c is exposed to the surface of insulator 16).

FIG. 1N shows a submemebr 10 comprising: an insulator 16, a plurality of positive, negative supply terminals 91, 92 embedded in the insulator 16 and each upper surface of positive, negative supply terminal 91, 92 is exposed to the surface of insulator 16 for electrical connection, wherein the lower surface 91c2 of third portion of positive supply terminal 91 is exposed to the lower surface 162 of insulator 16 for electrical connection; a part 85 coupled with the negative supply terminal 92 is encapsulated by the insulator 16 said part 85 serving as a heat spreader for enhancing the heat dissipation of submember 10; an adhesive mean 55 (such as adhesive tape etc.) attached to the positive terminal 91, said adhesive mean 55 is used for preventing the positive supply terminal 91 from being warped by the insulator 16 while operating a filling process of insulator 16.

FIG. 1P shows a submember 10 comprising: an insulator 16, a plurality of positive supply terminals 91 and negative supply terminal 92 are coupled with the insulator 16; wherein the third portion 91c of positive supply terminal 91 encapsulated by the insulator 16 and embedded therein. In this manner, the positive supply terminal 91 will be held by the insulator 16 more securely, then the reliability of submember 10 enhanced.

FIG. 1Q shows a submember 10, wherein a portion of third portion 91a of positive supply terminal 91 and a portion of negative supply terminal 92 are protruding the first upper surface 18 of insulator 16 for external connection.

FIG. 1R shows a submember 10 comprising: an insulator 16, said insulator 16 consists of a first portion 16a, a second portion 16b, a first upper surface 18, a side wall 163 and a second upper surface 19, wherein said side wall 163 is between the first upper surface 18 and the second upper surface 19; a plurality of positive supply terminals 91, each positive supply terminal 91 is staircase-shaped and having a first portion 91a, a second portion 91b and a third portion 91c, said positive supply terminal 91 coupled with the insulator 16, wherein said positive supply terminal 91 is situated on the insulator 16, the upper surface of positive supply terminal 91 is for electrical connection, said positive supply terminal 91 extending from the first upper surface 18 along the side wall 163 to the second upper surface 19 of insulator 16, wherein due to the positive supply terminal 91 is staircase-shaped, then (i). the first portion 91a and the third portion 91c are not in the same horizontal level, then it prevents conductive wires from causing short-circuit problem (refer to FIG. 15), in this manner, the reliability of electrical device enables to be enhanced; and (ii). Due to the side wall 163 of insulator 16 also coupled with a portion of positive supply terminal 91 (i.e. the lower surface 91b2 of the second portion 91b of positive supply terminal 91), then the surface of said positive supply terminal 91 contacted with the insulator 16 is increased, in this manner, the reliability of said submember 10 is enhanced; wherein the first portion 16a of insulator 16 serving as an insulating layer as required, said first portion 16a of insulator 16 may be made of adhesive tape, film, glue or the like.5

FIG. 1S shows a submember 10 comprising: an insulator 16, a conductive element 17; wherein said conductive element 17 extending from the first upper surface 18 of insulator 16 to the second upper surface 19 of insulator 16, said conductive element 17 is situated upon the insulator 16, and the upper surface of conductive element 17 is used for electrical connection; In addition, the side edge 90 of conductive element 17 is exposed to the side wall 13 of insulator 16.

FIG. 1T shows a submember 10 comprising: an insulator 16, a plurality of positive supply terminals 91 and negative supply terminals 92 encapsulated by the insulator 16 and embedded therein; wherein each positive supply terminal 91 is staircase-shaped, both the second portion 91b and third portion 91c having a co-planar surface "M" which is exposed to the second upper surface 19 of insulator 16 for electrical connection, due to the co-planar surface "M", it is more convenient for said positive supply terminal 91 to electrically connect to outside (because the co-planar surface "M" is larger.).

A third embodiment of submember of the present invention will be explained with reference to FIG. 1U and FIG. 1U-1~1U-8b which comprised of an insulator and conductive elements, wherein the structures (shown in FIG. 1U-1~1U-8b) of said third embodiment of submember are basically the alternatives of said third embodiment of submember shown in FIG. 1U (i.e. when the submember (shown in FIG. 1U) is formed, then by means of providing added processes such as etching process and/or sawing process to said submember, and then the alternatives (shown in FIG. 1U-1~1U-8b) of said submember (shown in FIG. 1U) will be formed respectively); Detailed descriptions as follow:

FIG. 1U shows a submember 10 comprising: an insulator 16 and a plurality of conductive elements 17, 17j, wherein said side edges 90, 90j and lower surfaces 12, 12j of conductive elements 17, 17j are encapsulated by the insulator 16 and embedded therein; wherein each extending portion 17h, 17jh of conductive elements 17, 17j is connected to each other, and the upper surfaces 11, 11j of conductive elements 17, 17j are protruded and exposed to the upper surface 161 of insulator 16 for external connection.

FIG. 1U-1 shows a submember 10A which is an alternative of the structure of submember 10 shown in FIG. 1U, wherein, After providing an etching process (not shown) to the conductive elements 17, 17j (shown in FIG. 1U), then a plurality of conductive elements 170, 170j are formed respectively, meanwhile a plurality of cavities 165, 165j are also formed simultaneously, furthermore, the insulator 16 having a first upper surface 18, a side wall 163 and a second upper surface 19, said side wall 163 is between the first upper surface 18 and the second upper surface 19 of insulator 16,wherein each conductive element 170, 170j is staircase-shaped, and each conductive element 170, 170j is extending from the first upper surface 18 along the side wall 163 to the second upper surface 19 of insulator 16, said each conductive element 170, 170j is coupled with the insulator 16 and situated thereon (i.e. the lower surface 170a2 of first portion 170a, the side edge 900 of first portion 170a and the co-planar surface "M" of second, third portion 170b, 170c coupled with the insulator 16, and the lower surface 170ja2 of first portion 170ja, the side edge 900j of first portion 170ja and the co-planar surface "MJ" of second, third portion 170jb, 170jc coupled with the insulator 16 too.); wherein the side wall 163 of insulator 16 also coupled the conductive elements 170, 170j, accordingly, there are a plural surfaces (refer to "M", 900, 170a2) of conductive element 170 contacted with the insulator 16 increased, in this manner, said conductive element 170 enables to be coupled with the insulator 16 more securely, then the reliability of said bubmember 10A enables to be enhanced, furthermore, due to the encapsulant (not shown) can be filled into the cavities 165, 165j of submember 10A respectively, then the surface of submember 10A contacted with the encapsulant (not shown) is increased, then the submember 10 enables to be encapsulated by the encapsulant more securely, as this result, the submember 10A will be not separated (peel-off) from the encapsulant easily, and then the reliability of said bubmember 10A also enables to be enhanced, moreover, a portion of said first portion 170a of conductive element 170 and a portion of the first portion 170ja of conductive element 170j placed in the cavities 165, 165j respectively, in addition, the lower surface 170a2, 170ja2 of first portion 170a, 170ja may be exposed to the lower surface 162 of insulator 16 as required; wherein said cavities 165, 165j are optional.

FIG. 1U-2 shows a submember 10A which is another alternative of the submember 10 shown in FIG. 1U, wherein, After providing both the etching process (not shown) and the sawing process (not shown), then said submember 10A is formed; wherein if not providing the sawing process, then the structure of said submember 10A (associated with the dotted portion) will be the same as the structure of submember 10A shown in FIGS. 1U-1.

FIGS. 1U-3 shows a submember 10A which is a further another alternative of the submember 10 shown in FIG. 1U, wherein, After providing both the etching process (not shown) and the sawing process (not shown), then said submember 10A is formed, wherein the conductive element 170 is extending from the first upper surface 18 along the side wall 163 to the second upper surface 19 of insulator 16; furthermore, the third portion 170jc of conductive element 170j may be connected to the third portion 170c of conductive element 170 as required (refer to FIG. 1U-5); moreover, the lower surfaces 170a2, 170ja2 of first portion 170a, 170ja may be exposed to the lower surface 162 of insulator 16 as required (refer to FIG. 1U-7); in addition, if not providing the sawing process, then the structure of said submember 10A (associated with the dotted portion) will be the same as the structure of submember 10A shown in FIGS. 1U-1.

FIGS. 1U-4 shows a submember 10A which is further another alternative of the submember 10 shown in FIG. 1U, wherein, After providing both the etching process (not shown) and the sawing process (not shown), then said submember 10A is formed, wherein each conductive element 170, 170j is not staircase-shaped in cross-sectional view (e.g. rectangular in cross-sectional view), each side edge 950, 950j of conductive element 170, 170j coupled with the side wall 163 of insulator, and each lower surface 120, 120j of conductive element 170, 170j coupled with the second upper surface 19 of insulator 16; wherein, the lower surface of conductive element may be exposed to the lower surface 162 of insulator 16 as required; furthermore, said side edge 955 of said conductive element 170 may be protruding the side wall 167 of insulator 16 as required, in this manner, a portion of the lower surface 120 of said conductive element 170 also enables to be exposed to said second upper surface 19 of said insulator 16 for electrical connection etc.

FIG. 1U-5 shows a submember 10A which is further another alternative of the submember 10 shown in FIG. 1U, wherein, basically, the structure of submember 10A shown in FIGS. 1U-5 is similar to the structure of submember 10A shown in FIGS. 1U-3, the difference is that said FIGS. 1U-5 shows the third portion 170jc of conductive element 170j is connected to the third portion 170c of conductive element 170, then, a co-planar surface "Q" is formed by the conductive elements 170, 170j; due to the co-planar surface "Q", it is more convenient for said submember 10A to electrically connect to outside (because the co-planar surface "Q" is larger.).

FIG. 1U-6 shows a submember 10A which is further another alternative of the submember 10 shown in FIG. 1U, wherein, the conductive element 170 serving as a positive supply terminal and the conductive element 170j serving as a negative supply terminal; due to the surface "R" of onductive element 170 and the upper surface 110jk of conductive element 170j are not in the same horizontal level (i.e. the upper surface 110jk is below the surface "R"),in this manner, it prevents conductive wires from short-circuit problem.

FIG. 1U-7 shows a submember 10A, the structure of said submember 10A shown in FIG. 1U-7 is similar to the structure of submember 10A shown in FIG. 1U-3, the difference is that said FIG. 1U-7 showing, wherein the portion 16c (dotted portion) of insulator 16 omitted from said insulator 16, in this manner, said insulator 16 including the upper surface 161, the side wall 13 and the lower surface 162 exclusively, and said conductive elements 170, 170j extending from the upper surface 161 to the side wall 13 of insulator 16 exclusively; Furthermore, the lower surfaces 170a2, 170ja2 of first portions 170a, 170ja of conductive elements 170, 170j exposed to the lower surface 162 of insulator 16 respectively, in this manner, Not only is the conductive element for external connection but the heat dissipation of said submember 10A is also enhanced (i.e. the heat dissipation of chip is enhanced; refer to the detailed descriptions in FIG. 1H and FIG. 14); In addition, the conductive element may be coupled with the insulator by means of its side edge only (e.g. if the conductive element 170 is not staircase-shaped (in cross-sectional view) but is rectangular (in cross-sectional view) etc., then the conductive element 170 is coupled with the side wall 13 of insulator 16 by means of the side edge 900 of said conductive element 170 exclusively. in this manner, said conductive element 170 is adjacent to said insulator 16.)

FIG. 1U-8a, 1U-8b (FIG. 1U-8b is a cross-sectional view of FIG. 1U-8a) show a submember 10A which is further another alternative of the submember 10 shown in FIG. 1U; wherein, basically, the structure of submember 10A shown in FIG. 1U-8(a, b) is similar to the structure of submember 10A shown in FIG. 1U-5, wherein said FIG. 1U-8a, 1U-8b show After providing both the etching process (not shown) and the sawing process (not shown), then said submember 10A is formed; wherein each side edge 900/900j, 970/970j of conductive element 170, 170j exposed to the atmosphere respectively, and the conductive element 170k situated on the first upper surface 18 of insulator 16 and the conductive elements 170, 170k situated on the second upper surface 19 of insulator 16.

The foregoing conductive elements of submember (10, 10A) may be made of conductive material such as copper foil, metallic alloy or the like, and the insulator of submember may be made of epoxy, ceramic, glass, silicon or the like, meanwhile, by means of plating process, the portion of conductive elements which is exposed to the surface of insulator can be plated by a conductive material such as nickel, silver, palladium, gold or the like, then the conductive element may be more convenient to electrically connected to outside; in addition, as shown in FIG. 1Ab, wherein both the lower surface 12 of conductive element 17 and the side edge 90 of conductive element 17 may be covered with an insulating film (not shown) as required, and said insulating film (not shown) is encapsulated by the insulator 16, in this manner, said insulating film (not shown) is between the conductive element 17 and the insulator 16, wherein said insulating film (not shown) can be serving as a portion of the insulator 16; Furthermore, the conductive element can be formed by a predetermined shape; In addition, the submember may also be employed as a substrate in which a plurality of conductive layers embedded in the insulator (see FIG. 1Ka, 1Kb), said conductive layers may be electrically connected to each other by via, conductive epoxy, tin etc.; Moreover, the side edge of conductive element which is embedded in the insulator may be not exposed to the side wall of the insulator as required.

FIGS. 2A–14 and FIG. 18 show embodiments of electrical device in accordance with the present invention, wherein the submember of electrical device is used by the first preferred embodiment of submember related to this invention.

FIG. 2A, 2B (FIG. 2B is a cross-sectional view of FIG. 2A) show an electrical device comprising: a base 30 serving as a substrate, said base 30 having a first surface 31 and a opposing second surface 32, said first surface 31 having a receiving area 80 for situating a chip thereon; a plurality of conductive fingers 70 surround the receiving area 80, a plurality of solder balls 50 attached to the opposing second surface 32 for external connection; a chip 20 situated on the receiving area 80, said chip 20 having an active surface 21 wherein a plurality of bond pads 72 disposed thereon for electrical connection; a submember 10 includes an insulator 16, a positive supply terminal 91 and a negative supply terminal 92 which are embedded in said insulator 16, said submember 10 is mounted on the active surface 21 of chip 20, wherein the bond pads 72 disposed on the active surface 21 of chip 20 are exposed to the submember 10 for electrical connection; a plurality of conductive wires 60 electrically connected the chip 20 to the conductive finger 70 and the submember 10 respectively, wherein the positive supply terminal 91 electrically connected to the chip 20 by means of a plurality of conductive wires 60, and the negative supply terminal 92 also electrically connected to the chip 20 by means of a plurality of conductive wires 60; an encapsulant 40 encapsulated the chip 20, conductive wires 60, conductive fingers 70 and the submember 10; according to said preferred embodiment of FIG. 2A, 2B, due to the conductive elements (positive supply terminals 91, negative supply terminal 92) are embedded in the insulator 16 (i.e. the conductive elements are not formed on the insulator 16), In this manner, each conductive element surface contacted with the insulator 16 is increased, then each conductive element encapsulated by the insulator 16 more securely, and then the reliability of submember 10 enables to be enhanced. Because it can be avoided to causing peeling-off problems by means of either the sawing process or the thermal effects; furthermore, due to the conductive elements (positive supply terminals 91, negative supply terminal 92) embedded in the insulator 16, then the submember 10 thickness becomes thinner and the material of insulator 16 can be saved too; meanwhile the distance "A" between said chip 20 and said conductive finger 70 also becomes shortened. (because it is not necessary for the conductive wires 60 to pass over the width "D", "E" of positive, negative supply terminals 91, 92 to electrically connect the chip 20 to the conductive fingers 70), and then, the materials of conductive wire can also be saved; Consequently, by means of the submember 10 in accordance with the present invention, Not only is saved the material of conductive wire but the reliability of electrical device can also be enhanced, Moreover, the thickness of submember 10 enables to become thinner, and the material of insulator 16 of submember 10 enables to be saved too.

FIG. 3 shows an electrical device comprising: a chip 20, a plurality of conductive wires 60, an encapsulant 40 and a base 35 serving as a substrate, said base 35 consists of a plurality leads 75 and an insulator 45, said base 35 having an receiving area 80 for situating the chip 20, wherein each conductive lead 75 having a conductive finger 70 for external connection; a submember 10 mounted on the chip 20, said positive, negative supply terminals 91, 92 are embedded in the insulator 16, wherein the side wall 13 of submember 10 is protruding the side edge 23 of chip 20 in order that the negative supply terminal 92 enables to be getting more closer to the conductive finger 70; then the distance "C" between the negative supply terminal 92 and the conductive finger 70 becomes shorter, and then the conductive wire 60 which is electrically connected the negative supply terminal 92 to the conductive finger 70 enables to be shortened, in this manner, the material saved and the reliability of electrical device enhanced; in addition, the another side wall 13k of submember 10 may be protruding the side edge 23k of chip 20 as required.

FIG. 4 shows an electrical device comprising: a base 30 serving as a substrate, a chip 20, a plurality of conductive wires 60, a submember 10 and an encapsulant 40; wherein the positive, negative supply terminals 91, 92 are embedded in the insulator 16 of submember 10, said submember 10 having a recessed portion 14, in this manner, said submember 10 having a first lower surface (i.e. the first lower surface 168 of insulator 16) and a second lower surface (i.e. the second lower surface 169 of insulator 16), and there is a height "H" formed by the recessed portion 14 of submember 10, said height "H" is higher than the height of conductive wires 60 which are electrically connected the chip 20 to the conductive fingers 70, then the conductive wires 60 electrically connected the chip 20 to the conductive fingers 70 can not touch the submember 10, and the submember 10 enables to be situated on the chip 20, wherein the first lower surface of submember 10 (i.e. the first lower surface 168 of insulator 16) is smaller than the active surface 21 of chip 20 and the upper surface of submember 10 (i.e. the upper surface 161 of insulator 16 associated with the upper surfaces of the positive, negative supply terminals 91, 92) is larger than the active surface 21 of chip 20, then both the positive supply terminal 91 and the negative supply terminal 92 enable to protrude the side edge 23 of chip 20 (i.e. the positive, negative supply terminals 91, 92 enable to be getting more closer to the conductive fingers 70), and then the conductive wires 60 electrically connected the submember 10 to the conductive fingers 70 are all shortened, in this manner, Not only the materials saved but the reliability of electrical device is enhanced; Furthermore an electrical component 200 encapsulated by the insulator 16 and buried therein is electrically connected the positive supply terminal 91 to the negative supply terminal 92 for preventing from the electromagnetic interference etc., wherein due to said electrical component 200 is encapsulated by the insulator 16 of submember 10 and buried therein, in this manner, the thickness of said submember 10 is thinner (because it is not necessary for the electrical component 200 to be mounted upon the upper surface of submember 10); said electrical component 200 may be a resistor, a capacitor, an electrical device such as transistor or the like.

FIG. 5 shows an electrical device; wherein a chip 20 having a central area 28 in which a plurality of bond pads (not shown) disposed thereon for electrical connection; two submembers 10, 15 mounted on the chip 20 are adjacent to each other, wherein the submember 10 having a positive supply terminal 91, and the submember 15 having a negative supply terminal 92., then the bond pads disposed on the central area 28 of chip 20 enable to electrically connect to the submember 10, 15 by means of conductive wires 60 respectively. In addition a third submember (not show) may also be mounted on the chip 20 for external connection as required.

FIG. 6 shows an electrical device; wherein a chip 25 is upon the submember 10, in this manner, said submember 10 is between the chip 20 and the chip 25, then said electrical device will be more powerful (due to the plural chips 20, 25).

FIG. 7 shows an electrical device, wherein the submember 10 having a through hole 81 and a plurality of positive supply terminals 91 embedded in the insulator 16; a chip 25 mounted on the chip 20 and placed in the through hole 81 of submember 10, then said electrical device will also be more powerful (due to the plural chips 20, 25), wherein due to the chip 25 is within the through hole 81 of submember 10,in this manner, Not only is said electrical device more powerful but the thickness of said electrical device also enables to be thinner; meanwhile, the submember 10 may also have a plurality of conductive fingers (not show) for external connection as required moreover the negative supply terminal 92 is situated upon the base (substrate) 30.

Figures 1, 1U, 2, 3, 4, 5, 6, 7, 8:
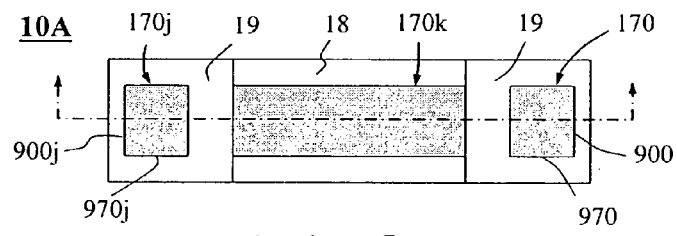
Figures 1, 1U, 2, 3, 4, 5, 6, 7, 8:
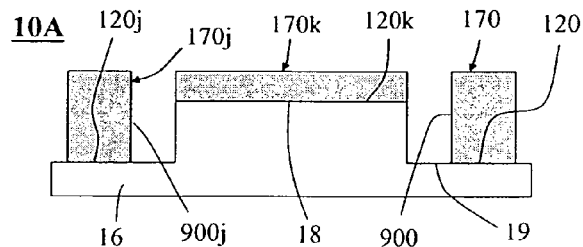
Figure 2:
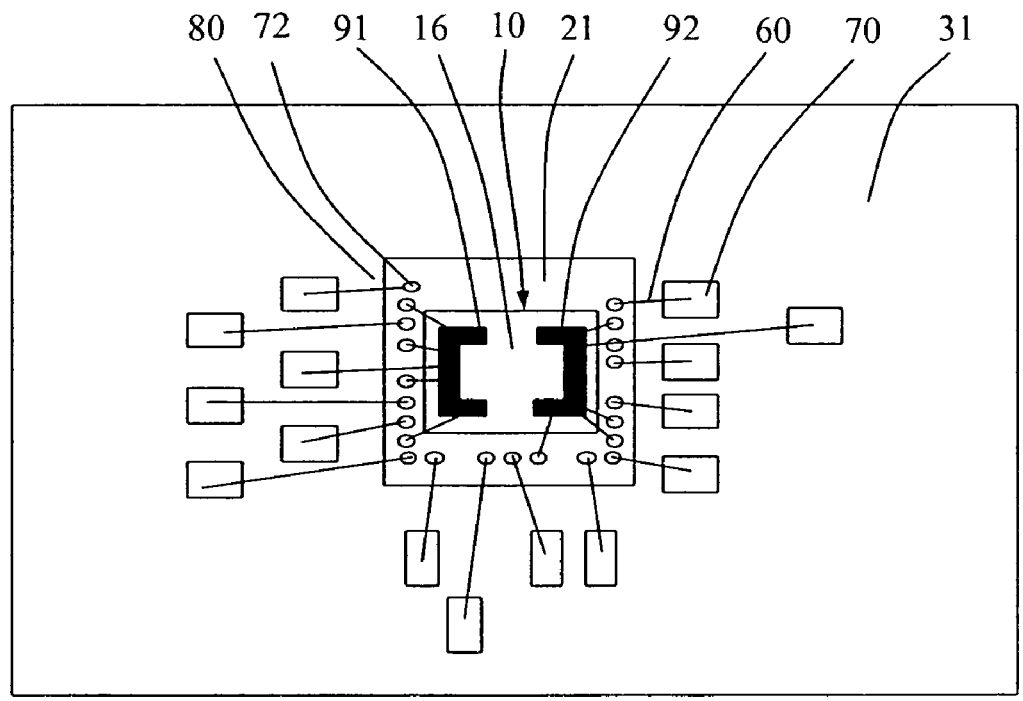
Figure 2:
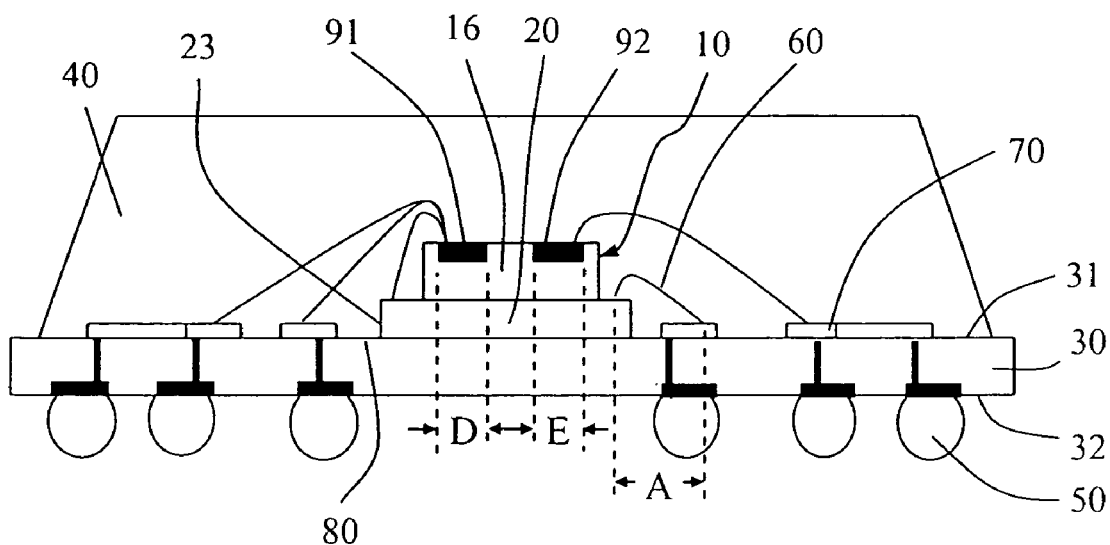
Figure 3:
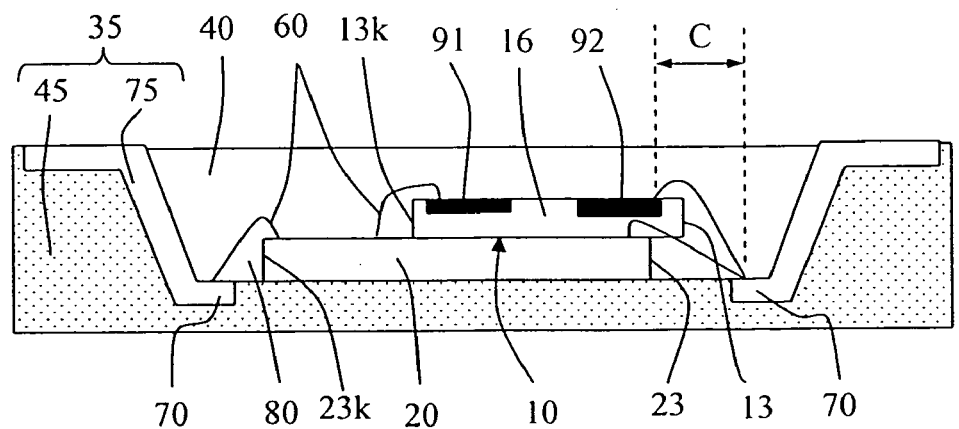
Figure 4:
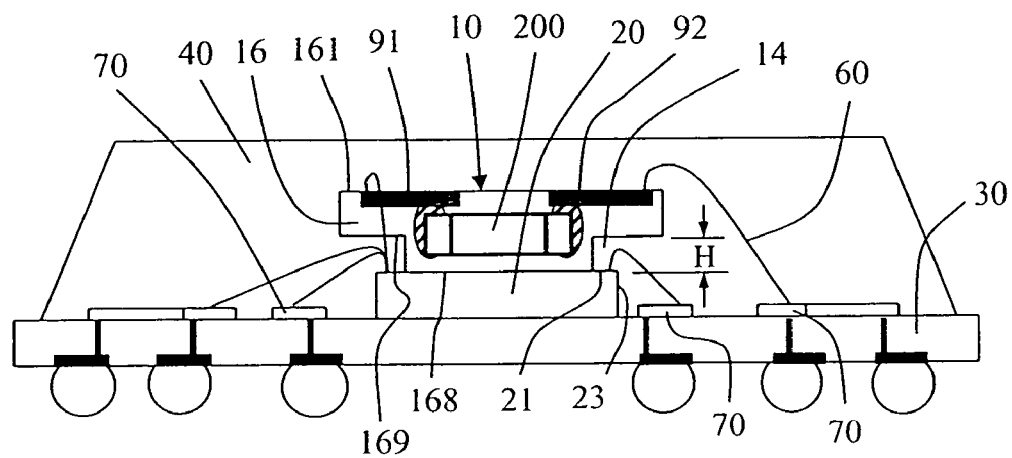
Figure 5:
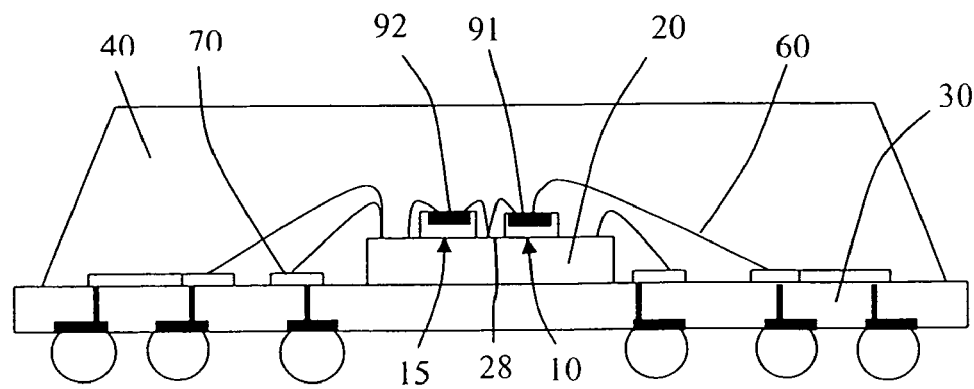
Figure 6:
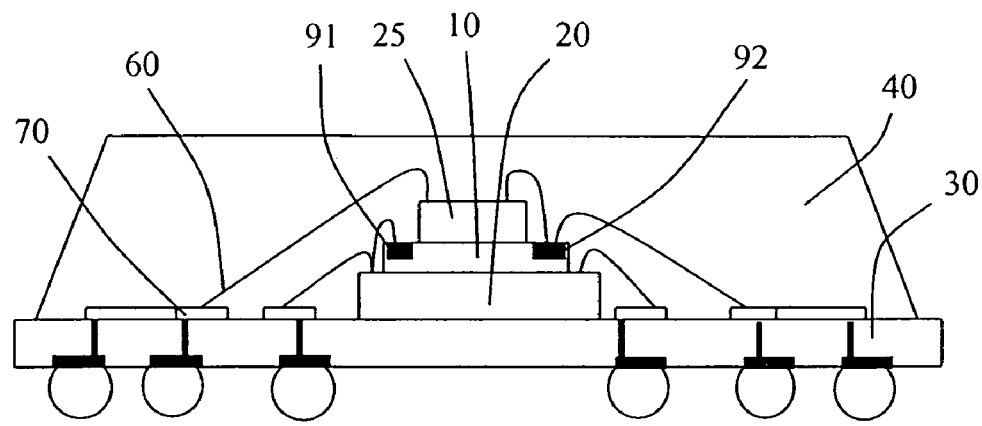
Figure 7:
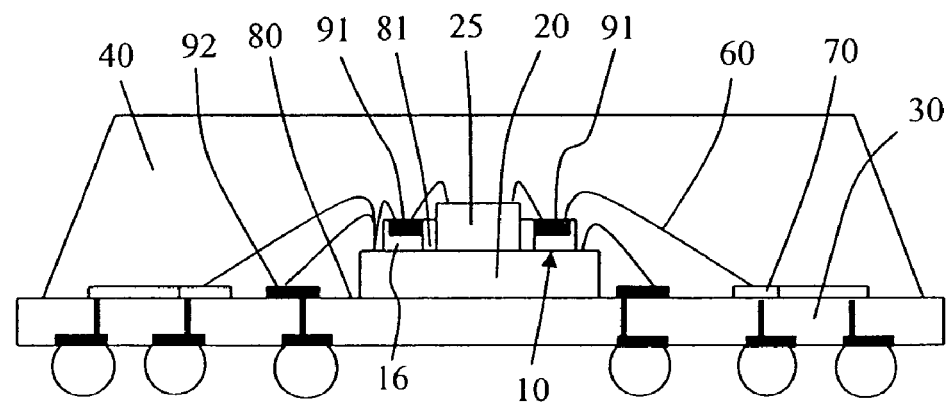
Figure 8:
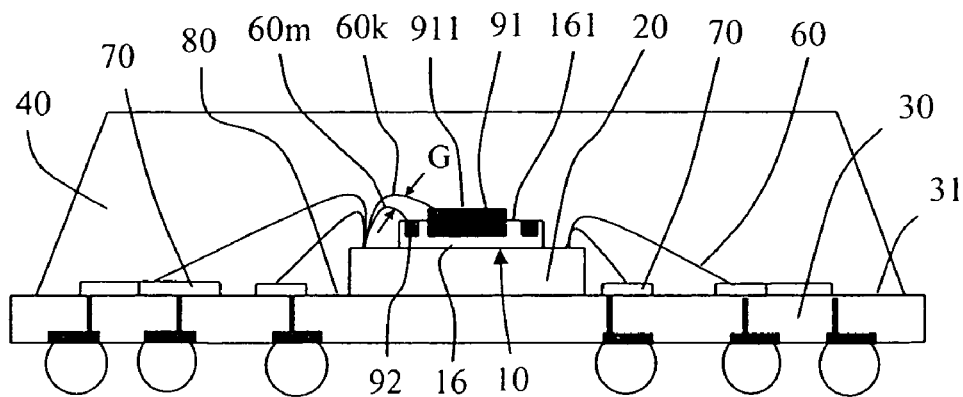

FIG. 8 shows an electrical device, wherein the positive, negative supply terminal 91, 92 embedded in the insulator 16, and the upper surface 911 of positive supply terminal 91 is protruding the upper surface 161 of insulator 16; a plurality of conductive wires 60k, 60m electrically connected to the positive, negative supply terminal 91, 92 respectively, Due to a portion of positive supply terminal 91 is protruding the insulator 16, then the gap "G" between the conductive wire 60k and the conductive wire 60m is wider, in this manner, it can prevent the conductive wires 60k, 60m from touching each other. So that the short circuit problem of electrical device enables to be avoided, in this manner, the reliability of said electrical device is enhanced; furthermore, due to the upper surface of said positive supply terminal 91 is protruding the upper surface 161 of insulator 16, then the surface of submember 10 contacted with the encapsulant 40 is increased, and then the submember 10 enables to be encapsulated by the encapsulant 40 more securely, as this result, the submember 10 will not be separated (peeled-off) from the encapsulant 40 easily, and then the reliability of said electrical device enhanced.

Figure 9:
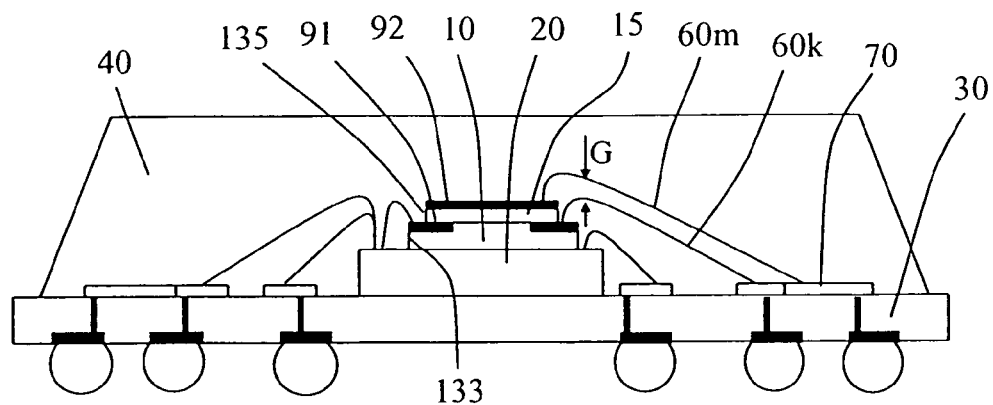
FIG. 9 is a cross-sectional view showing further another preferred embodiment of electrical device, in accordance with the invention, the submember is used by the first embodiment of submember of the present invention.

FIG. 9 shows an electrical device, wherein a submemeber 10 having a positive supply terminal 91; another submember 15 is smaller than the submember 10, said submember 15 having a negative supply terminal 92, said submember 15 is mounted on the submember 10, in this manner, both submember 10 and submember 15 are stacked; accordingly due to the positive supply terminal 91 and the negative supply terminal 92 are not in the same horizontal level, then the gap "G" between the conductive wires 60k which are electrically connected to the positive supply terminal 91 of the submember 10 and the conductive wires 60m which are electrically connected to the negative supply terminal 92 of the submember 15 enables to be wider. In this manner, the short circuit problem will be avoided, and the reliability of said electrical device enhanced.

Figure 10:
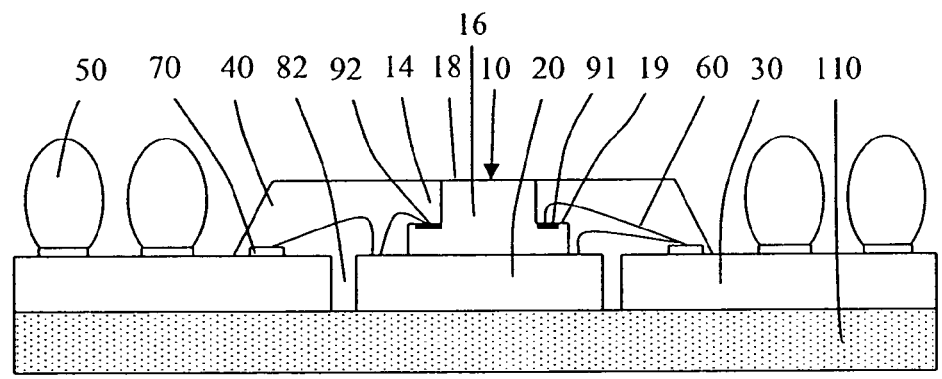
FIG. 10 is a cross-sectional view showing further another preferred embodiment of electrical device, in accordance with the invention, the submember is used by the first embodiment of submember of the present invention.

FIG. 10 shows an electrical device, wherein the base (substrate) 30 having a receiving area 82, said receiving area 82 is employed as a through hole for placing a chip therein; a plurality of conductive fingers 70 surrounding said receiving area (through hoe) 82; a heat spreader 110 coupled with the base 30; a chip 20 mounted on the heat spreader 110 and placed in the receiving area (through hole) 82; the submember 10 mounted on the chip 20, said submember 10 having a first upper surface 18, a second upper surface 19 and a recessed potion 14, wherein said second upper surface 19 having a positive supply terminal 91 and a negative supply terminal 92 for electrical connection, said first upper surface 18 of submember 10 is exposed to the encapsulant 40,in this manner, the heat dissipation of chip 20 enhanced, then the reliability of electrical device enhanced, furthermore due to the chip 20 is within the through hole (82), then the thickness of said electrical device is thinner, in addition, the insulator 16 of submember 10 may be made of ceramic, then the heat dissipation of chip 20 will be more efficient.

Figure 11:
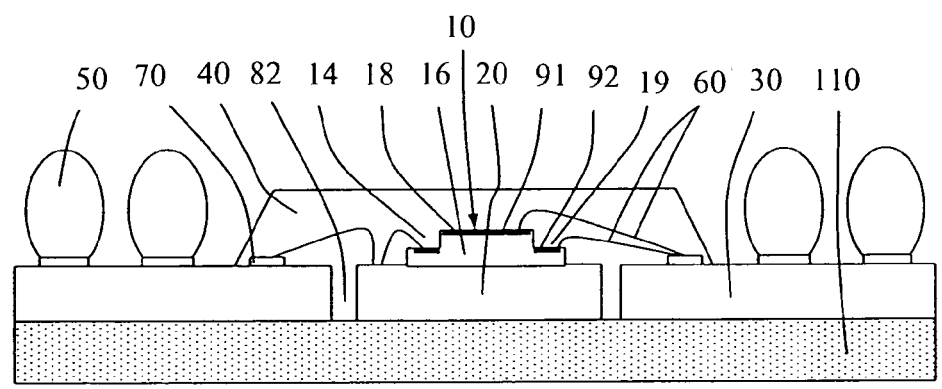
FIG. 11 is a cross-sectional view showing further another preferred embodiment of electrical device, in accordance with the invention, the submember is used by the first embodiment of submember of the present invention.

FIG. 11 shows an electrical device, wherein a positive supply terminal 91 embedded in the first upper surface 18 of insulator 16, and a negative supply terminal 92 embedded in the second upper surface 19 of insulator 16, the submember 10 mounted on the chip 20; accordingly, due to the positive supply terminal 91 and the negative supply terminal 92 are not in the same horizontal level, then the short-circuit problem will be avoided (refer to "G" in FIG. 9, and the reliability of said electrical device enhanced.

Figure 12:
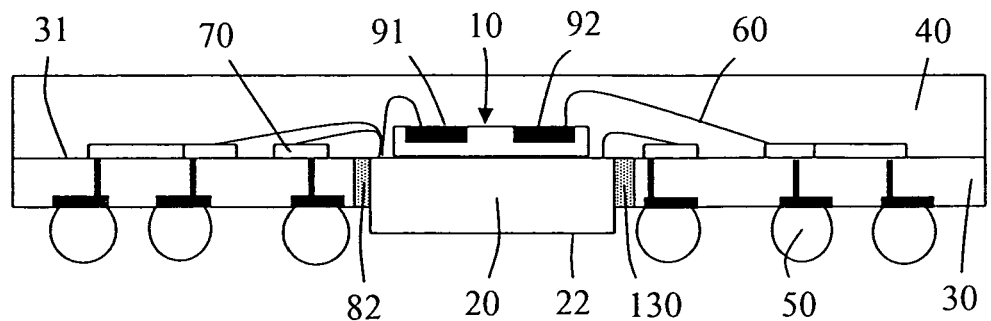
FIG. 12 is a cross-sectional view showing further another preferred embodiment of electrical device, in accordance with the invention, the submember is used by the first embodiment of submember of the present invention.

FIG. 12 shows an electrical device, wherein a chip 20 encapsulated by an adhesive mean 130 such as glue, resin or the like is situated in the receiving area (through hole) 82, then the chip 20 is coupled with the base (substrate) 30 by means of the adhesive mean 130, wherein said adhesive mean 130 may be serving as a portion of said encapsulant 40 as required, furthermore, the inactive surface 22 of chip 20 is protruded and exposed to the adhesive mean 130 for enhancing the heat dissipation of chip 20.

Figure 13:
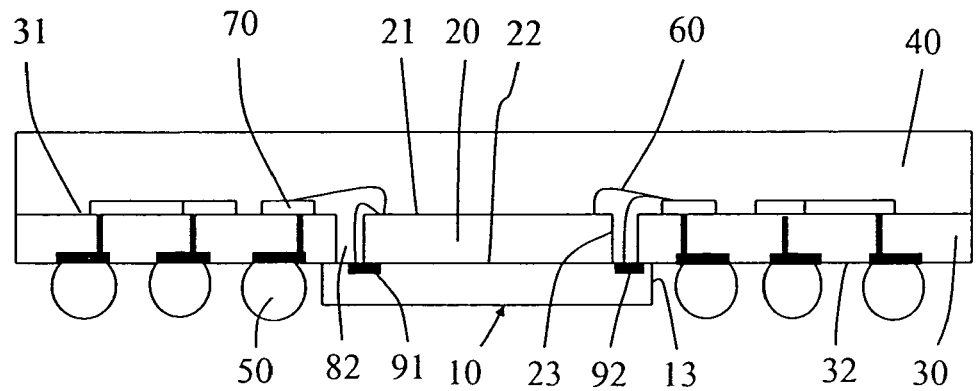
FIG. 13 is a cross-sectional view showing further another preferred embodiment of electrical device, in accordance with the invention, the submember is used by the first embodiment of submember of the present invention.

FIG. 13 shows an electrical device, wherein the submember 10 is coupled with the second surface 32 of base (substrate) 30, the thickness of said submember 10 is thinner than the height of solder ball 50; a chip 20 with its inactive surface 22 mounted on the upper surface of submember 10 is situated in the receiving area (through hole) 82 of base 30; accordingly, due to the thickness of said submember 10 is thinner than the height of solder ball 50 and the chip 20 is within the receiving area (through hole) 82 of base 30, then the thickness of electrical device is thinner; moreover, due to the submember 10 enables to be coupled with the inactive surface 22 of chip 20 (i.e. said submember 10 is not mounted on the active surface 21 of said chip 20) in this manner, it is more flexible for the submember 10 to be used in the industry.

Figure 14:
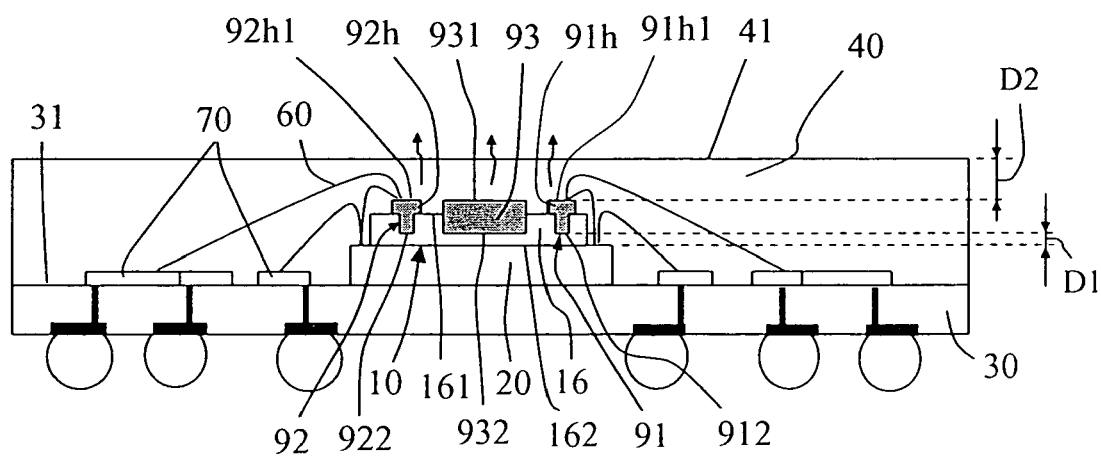
FIG. 14 is a cross-sectional view showing further another preferred embodiment of electrical device, in accordance with the invention, the submember is used by the first embodiment of submember of the present invention.

FIG. 14 shows an electrical device, wherein a submember 10 mounted on a chip 20, said submember 10 having a plurality of positive supply terminals 91/93, negative supply terminals 92; wherein the lower surfaces (912, 932, 922) are as close to the lower surface 162 of insulator 16 as possible for reducing the distance "D1" between the lower surface (912, 932, 922) and the lower surface 162 of insulator 16; meanwhile the upper surface 91h1 of extending portion 91h, the upper surface 931 of positive supply terminal 93 and the upper surface 92h1 of extending portion 92h are all protruding the upper surface 161 of insulator 16, in this manner, the distance "D2" between the upper surfaces 91h1, 931, 92h1 and the upper surface 41 of encapsulant 40 enable to be shortened; accordingly due to both the distance "D1" and the distance "D2" are shortened, In this manner, the heat dissipation of chip 20 enhanced (because the chip 20 generates heat while operating, wherein one of the paths of heat dissipation is from chip 20 passing through the submember 10 and then to the upper surface 41 of encapsulant 40; according to the mentioned-above path of heat dissipation, the shorter both the distance "D1" and the distance "D2" are, the faster the heat is transferred (i.e. the chip 20 is cooler). Furthermore, due to each conductive element having a portion which is protruding the upper surface 161 of insulator 16, in this manner, the surface of submember 10 contacted with the encapsulant 40 is increased, then the submember 10 enables to be encapsulated by the encapsulant 40 more securely, as this result, the submember 10 will not be separated (peel-off) from the encapsulant 40 easily, and then the reliability of electrical device enhanced; Furthermore, said extending portions 91h, 92h are as close to the periphery of submember 10 as possible, in this manner, both the length of conductive wires 60 which are electrically connected the submember 10 to the conductive fingers 70 and the length of conductive wires 60 which are electrically connected the submember 10 to the chip 20 enable to be shortened, then materials of conductive wire 60 saved, and cost saved; In addition, due to the extending portion 91*h*, 92*h* situated upon the upper surface 161 of insulator 16, it allows the extending portions 91*h*, 92*h* to extend upon the upper surface 161 of insulator 16 freely, In this manner, the restriction of designation of submember 10 will be reduced.

Figure 15:
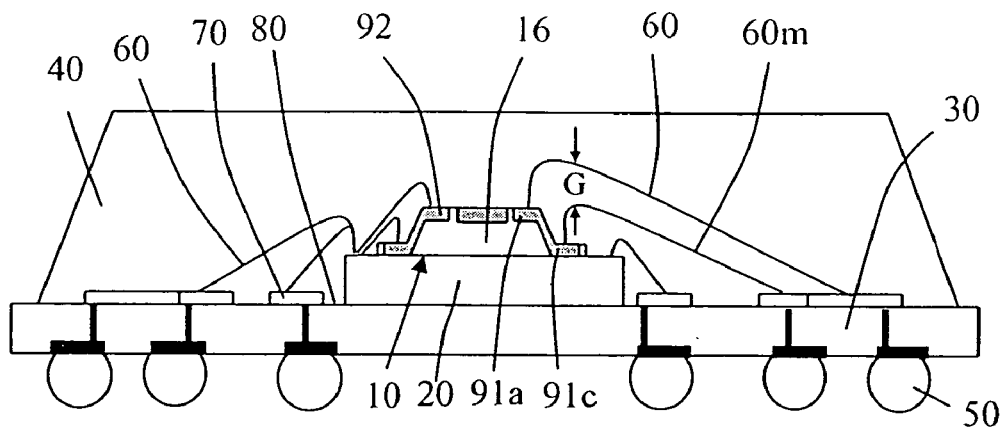
FIG. 15 is a cross-sectional view showing a preferred embodiment of electrical device, in accordance with the invention, the submember is used by the second embodiment of submember of the present invention.
Figure 16:
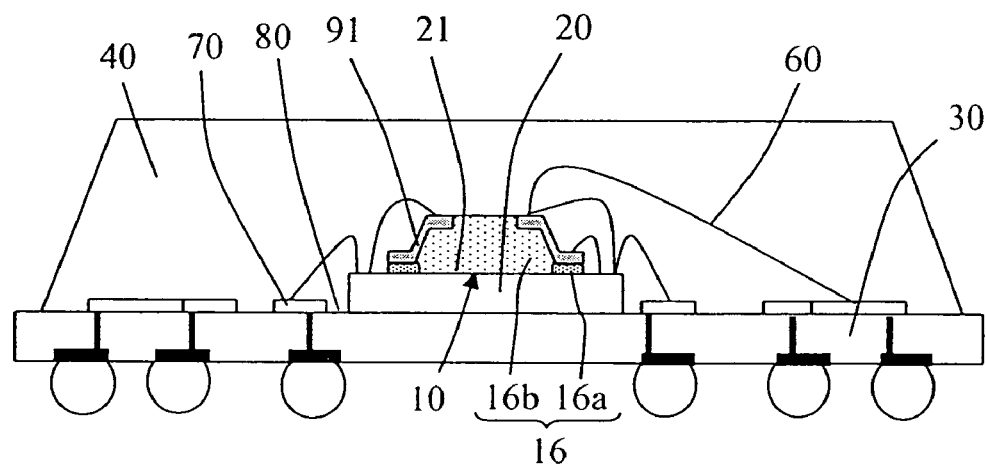
FIG. 16 is a cross-sectional view showing another preferred embodiment of electrical device, in accordance with the invention, the submember is used by the second embodiment of submember of the present invention.
Figure 17:
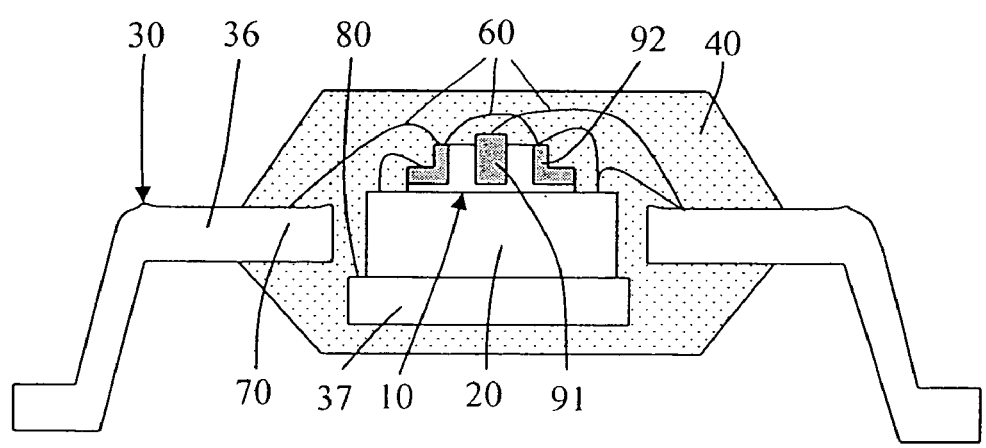
FIG. 17 is a cross-sectional view showing further another preferred embodiment of electrical device, in accordance with the invention, the submember is used by the second embodiment of submember of the present invention.

FIG. 15-17 show embodiments of electrical device in accordance with the present invention, wherein the submember of electrical device is used by the second preferred embodiment of submember related to this invention.

FIG. 15 shows an electrical device, wherein the submember 10 having a positive supply terminal 91 and a negative 92 for electrical connection. Wherein a plurality of conductive wires 60, 60*k*, 60*m* electrically connected the chip 20 to the conductive fingers 70 and the submember 10 respectively; accordingly, due to the gap "G" between the conductive wire 60*k* and the conductive wire 60*m* is wider, In this manner, it prevents from causing a short-circuit problem, in this manner, the reliability of said electrical device enhanced; In addition, the material of insulator 16 may be the same as the encapsulant 40 as required.

FIG. 16 shows an electrical device, wherein the insulator 16 of submember 10 consists of a first portion 16*a* and a second portion 16*b*, said submember 10 is mounted on the chip 20 by means of the insulator 16 directly (i.e. it is not necessary for the insulator 16 of submember 10 to be coupled with the chip 20 through an adhesive mean such as adhesive tape, glue, epoxy etc. which is between the insulator 16 and the chip 20); in this manner, not only is material saved, but the electrical device is also thinner.

FIG. 17 shows an electrical device, wherein the base 30 serving as a lead frame, said base 30 having a plurality of leads 36, After singulation, each lead 36 having a conductive finger 70 for electrical connection, said base 30 further having a die pad 37; a chip 20 situated on the receiving area 80 of die pad 37, a submember 10 mounted on the chip 20; wherein, the positive supply terminal 91 and the negative supply terminal 92 are not in the same horizontal level, then a short-circuit problem enables to be avoided.

Figure 18:
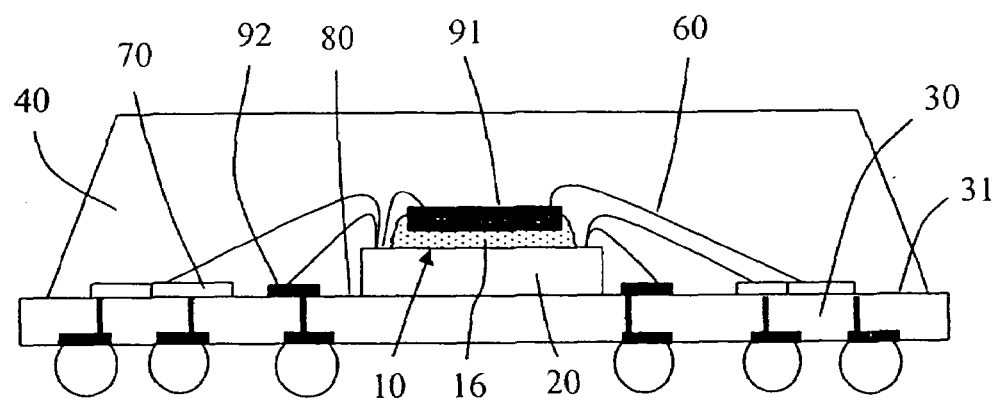
FIG. 18 is a cross-sectional view showing further another preferred embodiment of electrical device, in accordance with the invention, the submember is used by the first embodiment of submember of the present invention.

FIG. 18 shows an electrical device, wherein the submember 10 having a positive supply terminal 91, and said positive supply terminal 91 embedded in the insulator 16; said submember 10 is coupled with the chip 20 by the insulator 16 directly (i.e. it is not necessary for the insulator 16 of submember 10 to be coupled with the chip 20 through an adhesive mean such as glue, adhesive tape, epoxy etc. which is between the insulator 16 and the chip 20); accordingly, said electrical device is thinner, and material saved, meanwhile, an added (another) submember may be mounted on the chip as required.

Figure 19A:
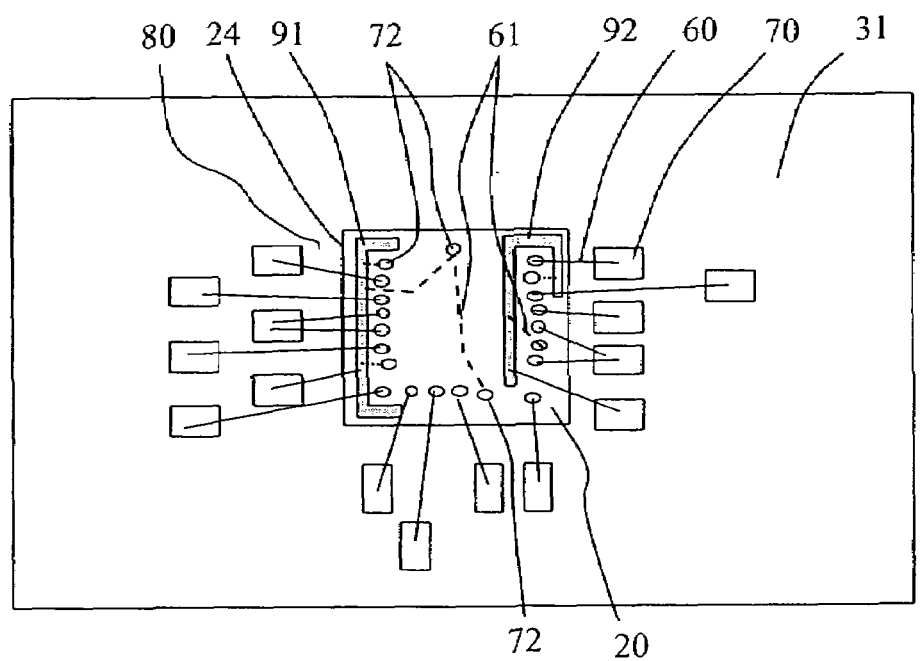
FIG. 19A is a top view showing a preferred embodiment of electrical device in accordance with the present invention, the submember is used by the fourth embodiment of submember of the present invention.
Figure 19B:
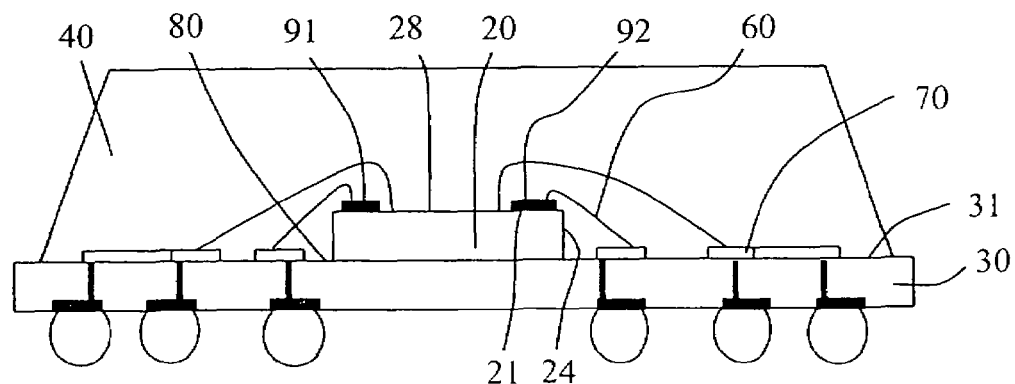
FIG. 19B shows a cross-sectional view of FIG. 19A.
Figure 20:
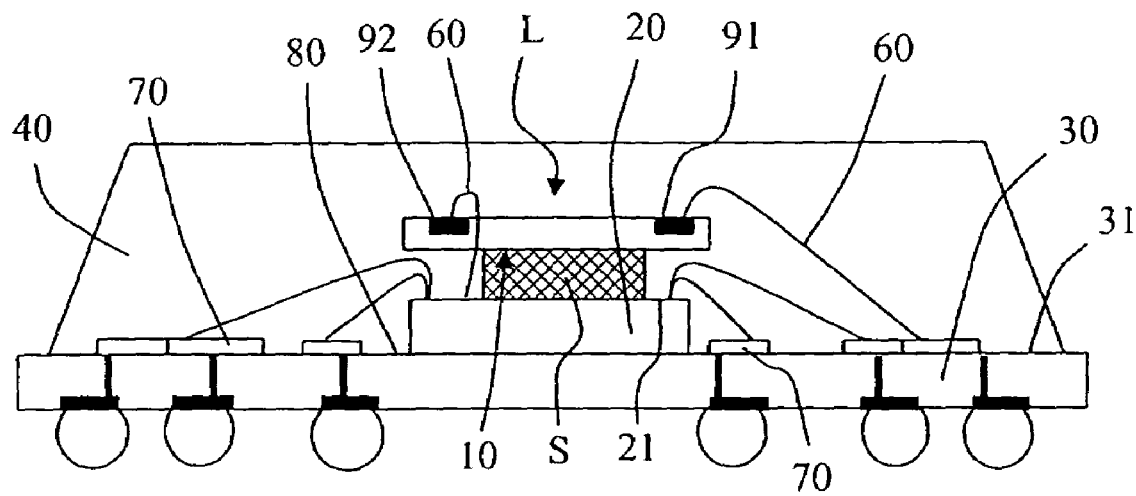
FIG. 20 is a cross-sectional view showing another preferred embodiment of electrical device in accordance with the present invention, the submember is used by the fourth embodiment of submember of the present invention.

FIG. 19~20 show embodiments of electrical device in accordance with the present invention, the submember of electrical device is used by the fourth preferred embodiment of submember related to this invention, wherein said submember combined with a chip and a conductive element (i.e. the conductive elements are disposed upon the active surface of chip, and meanwhile the insulator of submember has been moved out of the submember.); detailed descriptions as follow:

FIG. 19A, 19B (FIG. 19B is a cross-sectional view of FIG. 19A) show an electrical device, wherein both the positive supply terminal 91 and the negative supply terminal 92 disposed on the active surface 21 of chip 20, wherein the positive supply terminal 91 and a portion of negative supply terminal 92 are all between the bond pads 72 of chip 20 and the periphery 24 of chip 20; a plurality of metal lines 61 disposed on the central area 28 of active surface 21, said metal lines 61 electrically connected the bond pads 72 to positive/negative supply terminals 91/92 respectively, meanwhile, the metal lines 61 also electrically connected the bond pads 72 to the other ones accordingly, by means of the conductive elements (positive supply terminal 91, negative supply terminal 92) which are between the bond pads of chip and the periphery of chip, in this manner, the conductive elements (positive supply terminal 91, negative supply terminal 92) are as close to the periphery of chip as possible, then the conductive wires 60 electrically connected the conductive elements (positive supply terminal 91, negative supply terminal 92) to the conductive fingers 70 enable to be shortened. Meanwhile, due to both the positive supply terminal 91 and the negative supply terminal 92 disposed on the chip 20 then the insulator of submember can be omitted, in this manner, the material of insulator saved, cost saved, and the thickness of said electrical device is thinner.

FIG. 20 shows an electrical device, wherein the submember 10 having a positive supply terminal 91 and a negative supply terminal 92, said submember 10 serving as a power chip, and said submember 10 mounted on the chip 20 by a spacer "S" which is between the submember 10 and the chip 20, the surfaces of said spacer ".S" are smaller than both the active surface 21 of chip 20 and the lower surface of submember 10, wherein due to the height of spacer "S" between the submember 10 and the chip 20 is higher than the height of conductive wires 60 which are electrically connected the chip 20 to the conductive fingers 70, in this manner, the conductive wires 60 electrically connected the chip 20 to the conductive fingers 70 will not touch the submember 10, besides, both the positive supply terminal 91 and the negative supply terminal 92 are closer to the conductive fingers 70 too (refer to FIG. 3, 4), then both the conductive wires 60 electrically connected the chip 20 to the conductive fingers 70 and the conductive wires 60 electrical connected the submember 10 to the conductive fingers 70 enable to be shortened; in addition, there is a Light supply "L" lighting on the submember 10, in order that the submember 10 generates electricity for supplying the chip 20 through conductive wires 60 which are electrically connected the submember 10 to the chip 20.

Figure 21:
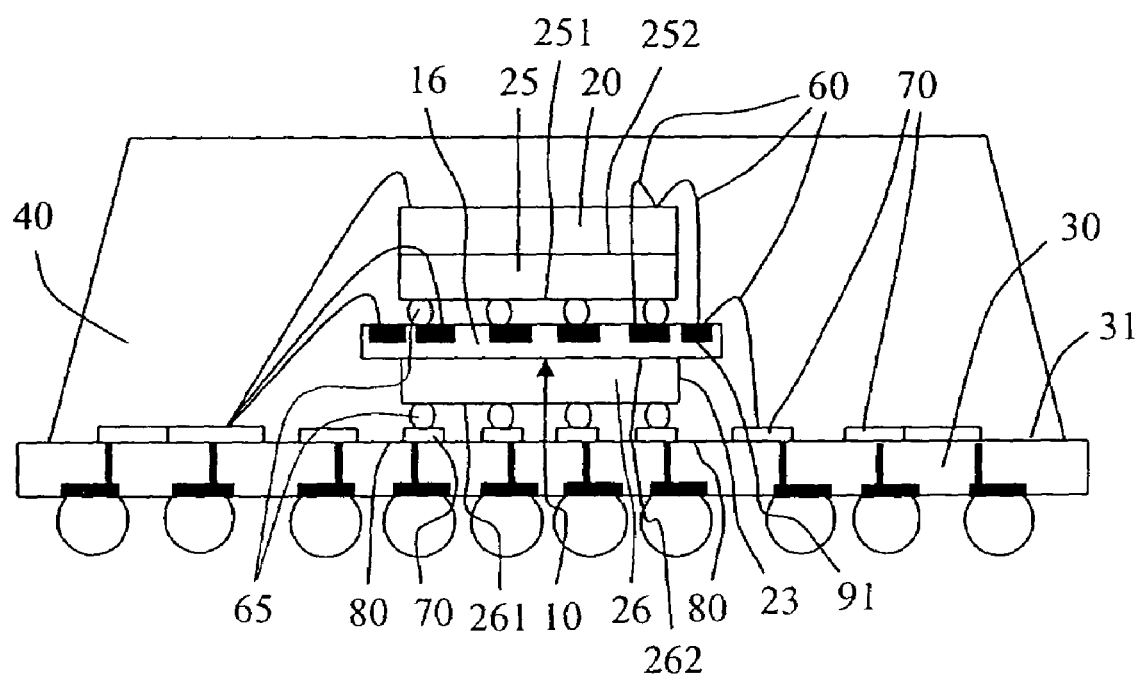
FIG. 21 is a cross-sectional view showing further another preferred embodiment of electrical device in accordance with the present invention, the submember is used by the first embodiment of submember of the present invention.
Figure 23A:
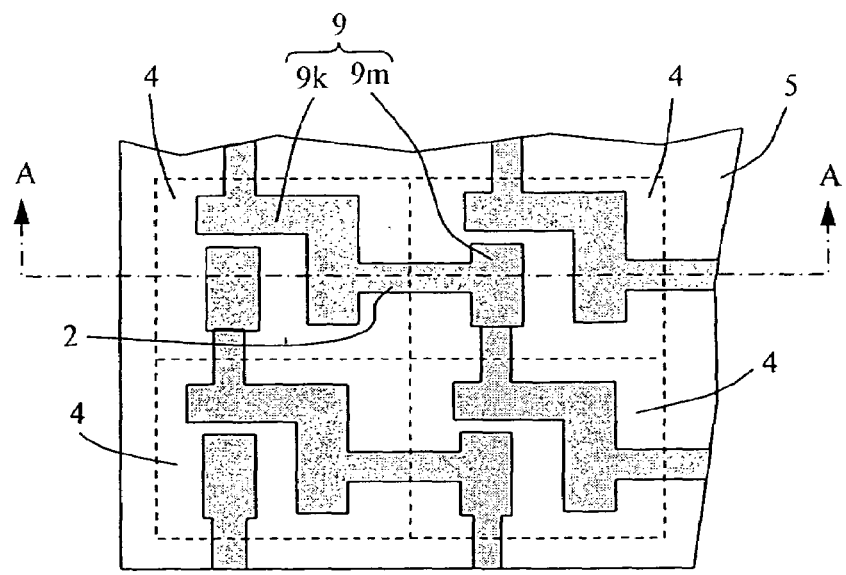
FIG. 23A shows a top view of one of the last two steps of manufacturing a circuit board according to a prior art.
Figure 23B:
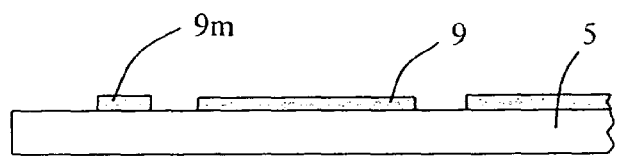
FIG. 23B shows a cross-sectional view of FIG. 23A.
Figure 24:
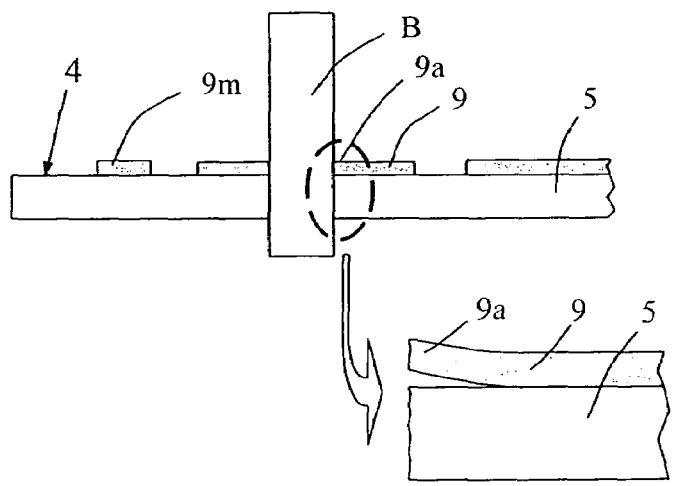
FIG. 24 shows a cross-sectional view of the last step of manufacturing a circuit board according to a prior art.
Figure 2:
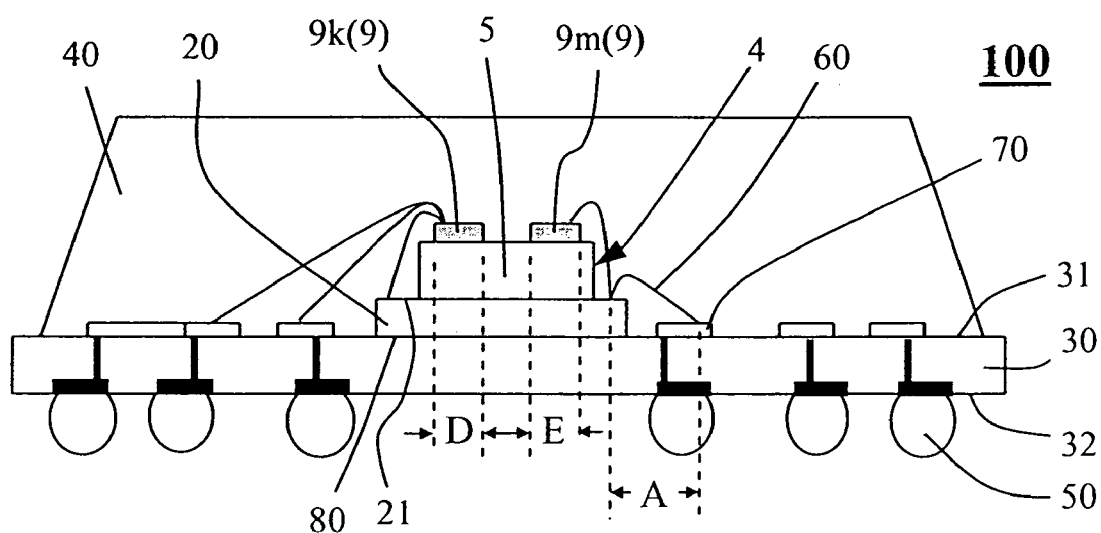

FIG. 21 shows an electrical device comprising: a base (substrate) 30, a plurality of chips 20/25/26, wherein the chips 25, 26 are flip-chips, a submember 10 in which a plurality of conductive elements (such as positive supply terminal 91, negative supply terminal 92 or conductive element 17) embedded in the insulator 16 for electrical connection, a plurality of conductive wires 60 and an encapsulant 40; wherein the chip 20 is mounted on the inactive surface 252 of chip 25, the active surface 251 of said chip 25 electrically connected to the corresponding conductive elements 91 of submember 10 by a plurality of bumps 65 respectively, the submember 10 is mounted on the inactive surface 262 of chip 26, the active surface 261 of said chip 26 electrically connected to the base (substrate) 30 by a plurality of bumps 65, in this manner, the chip 20, the chip 25, the submember 10 and the chip 26 are all stacked, and said chip 26 is also coupled with said base (substrate) 30 (i.e. said chip 26 is mounted on said base 30 through said plural bumps 65), wherein the submember 10 is between the chip 25 and the chip 26, wherein the chip 26 is situated in the receiving area 80 of base 30; a plurality of conductive wires 60 electrically connected the submember 10 to the chip 20 and the conductive fingers 70 of base 30 respectively; consequently, By means of the submember 10 in accordance with the present invention, a plurality of different types of chips (i.e. the flip chip and the wire-bonded chip) enables to be stacked, in this manner, not only is the reliability of electrical device enhanced (because the conductive elements embedded in the insulator of submember.) but the electrical device also enables to become more powerful, Furthermore, said chips 20, 25 may be employed as electrical components as required, moreover the submember 10 may be coupled with the chip 26 by a spacer (see "S" in FIG. 20) such as glue, epoxy, adhesive tape, dummy chip etc.

According to the foregoing invention, due to the conductive element encapsulated by the insulator and embedded therein, then (i). the surface of conductive element contacted with the insulator is increased, and then the reliability of the submember is enhanced; (ii). the thickness of submember is thinner and the heat dissipation of chip is also enhanced; (iii). the material of insulator is saved and cost saved; meanwhile materials of conductive wires saved and cost saved; and (iiii). a portion of the conductive element enables to be protruding the insulator for avoiding a short-circuited problem of conductive wire; furthermore, due to the conductive element enables to be formed by a predetermined shape (e.g. staircase-shaped), then the surface of conductive element coupled with the insulator is also increased, in this manner, not only the reliability of submember is enhanced, but the short circuit problem of conductive wire is also avoided; Furthermore, the submember of the present invention, wherein the conductive element situated on the insulator wherein due to the conductive element extending from the first upper surface along the side wall to the second upper surface of said insulator, then (i). the surface of conductive element contacted with the insulator is increased, and then the reliability of the submember is enhanced; (ii). the heat dissipation of chip is enhanced; (iii). due to the first portion and the third portion of the conductive element is not in the same horizontal level, then it prevents conductive wires from causing short-circuit problem (refer to FIG. 15).

Moreover, since many such various alterations can be made to the foregoing descriptions, for examples, as shown in FIG. 1U, wherein the conductive element 17 may further comprise a through hole or a cavity as required; as shown in FIG. 1 U-4, wherein an added conductive element may be involved in the submembeer 10A, said added conductive element embedded in the insulator 16, wherein said added conductive element is among the conductive element 170 and the conductive element 170j as required; as shown in FIG. 4, an added (another) electrical component may be mounted on the upper surface of submember 10 as required; as shown in FIG. 1U-7, said submember 10A may also be in stead of the submember 10 of the electrical device shown in FIG. 2A, 2B as required, and when said submember 10A (FIG. 1U-7) mounted on the active surface 21 of chip 20 (FIG. 2A, 2B), wherein due to the conductive element (170, 170j) of said submember 10A extending from the upper surface 161 to the side wall 13 of said insulator 16, in this manner, the distance between said conductive element and the conductive finger 70 of the base 30 enables to become shorter, then the distance of conductive wire 60 electrically connected said conductive element (170, 170j) to the conductive fingers 70 of base 30 enables to become shorter too, and then the material of said conductive wire 60 saved, cost saved, moreover, a plurality of added conductive elements (not shown) may be coupled with the lower surface of said submember 10A (i.e. the lower surface 162 of insulator 16 associated with the lower surfaces 170a2, 170ja2 of first portion 170a, 170ja of the conductive elements 170, 170j shown in FIG. 1U-7), wherein each added conductive element connected to each corresponding conductive element 170, 170j for electrical connection; as shown in FIG. 20, wherein at least an another spacer may be positioned between said chip 20 and the receiving area 80 of base 30 (i.e. said another spacer is between said chip 20 and said base 30), and said another spacer may be selectively serving as a plastic plate, ceramic plate, copper plate, printed circuit board, chip, submember or glass etc.; as show in FIG. 9, an added (another) submember may be mounted on the submember 15, and wherein said side edge 135 of submember 15 may be protruding the side edge 133 of submember 10 as required; as shown in FIG. 11, wherein, the positive supply terminal 91 may be situated on the first upper surface 18 of insulator 16 as required; as show in FIG. 12, an added (another) chip may be mounted on the submember 10 as required; as show in FIG. 21, wherein the submember 10 shown in FIG. 1K(a) may also be instead of the submember 10 shown in FIG. 21; moreover, by means of different structures of electrical device, the conductive element (positive, negative supply terminal) may also be situated on a chip; as shown in FIG. 1U-1, wherein the conductive element 170 which is consisted of the first, second and third portions 170a, 170b and 170c can also be employed as a conductive element associated with an extending portion (refer to the "91, 91h" in FIG. 1Ga, 1Gb): as shown in FIG. 1U-4. wherein the conductive element 170 may also be surrounding the side wall 163 of insulator 16; accordingly, it is to be understood that the scope of the invention is not limited to the disclosed embodiments but is defined by the appended claims.

What is claimed is:

1. An electrical device, comprising:
   at least a chip;
   at least a base, said chip coupled with said base, wherein said chip is electrically connected to said base through at least a conductive mean; and
   at least a submember, said submember mounted on said chip, said submember including an insulator and at least a conductive element; said insulator having at least a first upper surface, a first lower surface and a side wall, said conductive element having at least an upper surface, a lower surface and a side edge, wherein said conductive element is encapsulated by said insulator, in this manner, at least a portion of said side edge of said conductive element is embedded in said insulator, wherein a portion of said conductive element is exposed to said first upper surface of said insulator for external connection; and
   an encapsulant, wherein the encapsulant seals said chip, said conductive mean, said base and said submember.

2. The electrical device as defined in claim 1, wherein at least a portion of said conductive element of said submember is protruding said first upper surface of said insulator of said submember.

3. The electrical device as defined in claim 1, wherein said conductive element of said submember having at least an extending portion, wherein at least a portion of said extending portion is coupled with said first upper surface of said insulator of said submember.

4. The electrical device as defined in claim 1, wherein said chip is mounted on said base of said electrical device, and said conductive mean electrically connecting said chip to said base selectively serves as a conductive wire or a conductive bump; and wherein said base selectively serves as a substrate or a lead frame.

5. The electrical device as defined in claim 1, further comprising at least another conductive mean having two ends, wherein said one end of said another conductive mean is connected to said submember, and the other end of said another conductive mean is selectively connected to either said chip or said base, and wherein said another conductive mean is sealed by said encapsulant, and wherein said another conductive mean serves as a conductive wire.

6. The electrical device as defined in claim 1, wherein said conductive element of said submember is employed as a heat spreader.

7. A submember for being mounted on a chip, said chip coupled with a base, said chip electrically connected to said base, and an encapsulant sealing said submember, said chip and said base, comprising:

at least a conductive element; and at least an insulator having a first upper surface, a first lower surface and a side wall, said first lower surface of said insulator being mounted to said chip, wherein at least a portion of said conductive element is embedded in said insulator, and wherein another portion of said conductive element is exposed to said first upper surface of said insulator for external connection.

8. The submember as defined in claim 7, wherein said conductive element has at least an upper surface, a lower surface and a side edge, and wherein at least a portion of said side edge of said conductive element is embedded in said insulator, and wherein said upper surface of said conductive element is exposed to said first upper surface of said insulator for external connection.

9. The submember as defined in claim 8, wherein said upper surface of said conductive element protrudes from said first upper surface of said insulator.

10. The submember as defined in claim 8, wherein said conductive element has at least an extending portion, wherein at least a portion of said extending portion is coupled with said first upper surface of said insulator of said submember.

11. The submember as defined in claim 8, wherein said upper surface of said conductive element is coplanar with said first upper surface of said insulator.

12. The submember as defined in claim 8, wherein said upper surface of said conductive element is below said first upper surface of said insulator.

13. The submember as defined in claim 7, wherein said conductive element is connected to the outside through at least a conductive material, said conductive material selectively serving as a nickel, silver, palladium, or gold.

* * * * *